(12) United States Patent
Hanzawa et al.

(10) Patent No.: US 7,173,838 B2
(45) Date of Patent: Feb. 6, 2007

(54) CONTENT ADDRESSABLE MEMORY DEVICE

(75) Inventors: Satoru Hanzawa, Hachioji (JP); Tomonori Sekiguchi, Tama (JP); Riichiro Takemura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/072,246

(22) Filed: Mar. 7, 2005

(65) Prior Publication Data

US 2005/0270818 A1 Dec. 8, 2005

(30) Foreign Application Priority Data

Jun. 8, 2004 (JP) ............................. 2004-169314

(51) Int. Cl.
G11C 15/00 (2006.01)
G11C 15/04 (2006.01)

(52) U.S. Cl. .................. 365/49; 711/108; 365/230.03

(58) Field of Classification Search .................. 365/49; 711/108

See application file for complete search history.

(56) References Cited

U.S. PATENT DOCUMENTS 4,755,974 A * 7/1988 Yamada et al. ............... 365/49

6,288,922 B1 * 9/2001 Wong et al. ................... 365/49

OTHER PUBLICATIONS

T. Miwa et al., "A 1-Mb 2-Tr/b Nonvolatile CAM Based on Flash Memory Technologies," IEEE Journal of Solid-State Circuits, vol. 31, No. 11, Nov. 1996, pp. 1601-1609.

* cited by examiner

Primary Examiner—Amir Zarabian
Assistant Examiner—Michael Weinberg
(74) Attorney, Agent, or Firm—Miles & Stockbridge P.C.

(57) ABSTRACT

In accordance with the regions which are component elements of memory information (entry) and input information (comparison information or search key), quaternary information including a pair of the minimum value and the difference or ternary information including a pair of the data and the mask are used as I/O signals. In addition, in accordance with the two types of information, two types of encoding circuits and decoding circuits are disposed, and either one of the encoding circuits and the decoding circuits are activated in accordance with the values set to the registers disposed to designate the format of information in each region of the entry and the search key. By selecting the desired register from the plurality of registers in response to the external command signals and address signals, the encoding and decoding in accordance with the information to be processed are carried out.

10 Claims, 25 Drawing Sheets

FIG.2

| COMBINATION OF 0 TO 3 (DECIMAL SYSTEM) | CAM I/O SIGNAL FOR ENTRY ||||||| CAM INTERNAL SIGNAL |
| --- | --- | --- | --- | --- | --- | --- | --- | --- |
| | IP ADDRESS REGION ||| FLAG REGION |||| QUATERNARY-ENCODED ENTRY |
| | QUATERNARY NOTATION | MINIMUM VALUE | DIFFERENCE | TERNARY NOTATION | DATA | MASK | | |
| 0 | 01 | 00 | 00 | 00 | 00 | 11 | | 0001 |
| 1 | 02 | 01 | 00 | 01 | 01 | 11 | | 0010 |
| 2 | 10 | 10 | 00 | 10 | 10 | 11 | | 0100 |
| 3 | 20 | 11 | 00 | 11 | 11 | 11 | | 1000 |
| 0,1 | 03 | 00 | 01 | 0X | 0Z | 10 | | 0011 |
| 2,3 | 30 | 10 | 01 | 1X | 1Z | 10 | | 1100 |
| 0,2 | 11 | (10) | (10) | X0 | Z0 | 01 | | 0101 |
| 1,3 | 22 | (11) | (10) | X1 | Z1 | 01 | | 1010 |
| 1,2 | 12 | 01 | (01) | — | — | — | | 0110 |
| 0,3 | 21 | (11) | 10 | — | — | — | | 1001 |
| 0,1,2 | 13 | 00 | 10 | — | — | — | | 0111 |
| 1,2,3 | 32 | 01 | (11) | — | — | — | | 1110 |
| 2,3,0 | 31 | (01) | (11) | — | — | — | | 1101 |
| 0,1,3 | 23 | (10) | 01 | — | — | — | | 1011 |
| 0,1,2,3 | 33 | 00 | 11 | XX | ZZ | 00 | | 1111 |
| NONE | 00 | (11) | (11) | — | — | — | | 0000 |

X:Don't care(LOCAL MASK), Z : INDETERMINABLE VALUE

| COMBINATION OF 0 TO 3 (DECIMAL SYSTEM) | CAM I/O SIGNAL FOR SEARCH KEY | | | | | | CAM INTERNAL SIGNAL |
|---|---|---|---|---|---|---|---|
| | IP ADDRESS REGION | | | FLAG REGION | | | QUATERNARY-ENCODED SEARCH KEY |
| | QUATERNARY NOTATION | MINIMUM VALUE | DIFFERENCE | TERNARY NOTATION | DATA | MASK | |
| 0 | 01 | 00 | 00 | 00 | 00 | 11 | 0001 |
| 1 | 02 | 01 | 00 | 01 | 01 | 11 | 0010 |
| 2 | 10 | 10 | 00 | 10 | 10 | 11 | 0100 |
| 3 | 20 | 11 | 00 | 11 | 11 | 11 | 1000 |
| 0,1 | — | — | — | 0X | 0Z | 10 | 0011 |
| 2,3 | — | — | — | 1X | 1Z | 10 | 1100 |
| 0,2 | — | — | — | X0 | Z0 | 01 | 0101 |
| 1,3 | — | — | — | X1 | Z1 | 01 | 1010 |
| 1,2 | — | — | — | — | — | — | 0110 |
| 0,3 | — | — | — | — | — | — | 1001 |
| 0,1,2 | — | — | — | — | — | — | 0111 |
| 1,2,3 | — | — | — | — | — | — | 1110 |
| 2,3,0 | — | — | — | — | — | — | 1101 |
| 0,1,3 | — | — | — | — | — | — | 1011 |
| 0,1,2,3 | 33 | 00 | 11 | XX | ZZ | 00 | 1111 |

X:Don't care(GLOBAL MASK), Z:INDETERMINABLE VALUE  : UNUSED CODE

PRIORART
FIG. 20
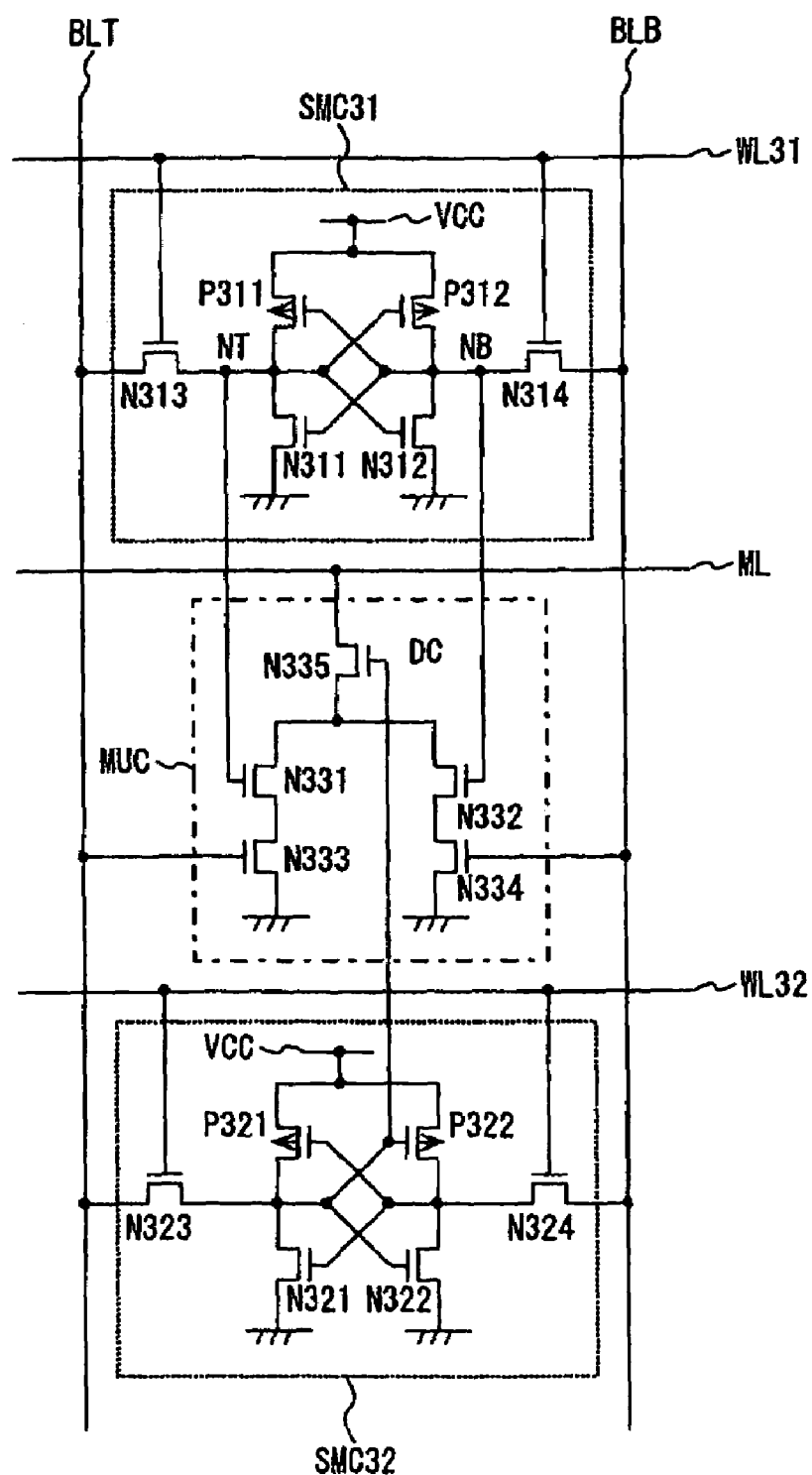

FIG.21

| COMBINATION OF 0 TO 3 (DECIMAL SYSTEM) | TERNARY NOTATION | One-hot-spot BLOCK CODE NOTATION |
|---|---|---|
| 0 | 00 | 0001 |
| 1 | 01 | 0010 |
| 2 | 10 | 0100 |
| 3 | 11 | 1000 |
| 0,1 | 0X | 0011 |
| 2,3 | 1X | 1100 |
| 0,2 | 0X | 0101 |
| 1,3 | X1 | 1010 |
| 0,3 | CANNOT EXPRESS | 1001 |
| 1,2 | CANNOT EXPRESS | 0110 |
| 0,1,2 | CANNOT EXPRESS | 0111 |
| 1,2,3 | CANNOT EXPRESS | 1110 |
| 2,3,0 | CANNOT EXPRESS | 1101 |
| 0,1,3 | CANNOT EXPRESS | 1011 |
| 0,1,2,3 | XX | 1111 |

CONTENT ADDRESSABLE MEMORY DEVICE

CROSS-REFERENCE TO RELATED APPLICATION

The present application claims priority from Japanese Patent Application JP 2004-169314 filed on Jun. 8, 2004, the content of which is hereby incorporated by reference into this application.

TECHNICAL FIELD OF THE INVENTION

The present invention relates to a semiconductor device. More specifically, it relates to a semiconductor device including a content addressable memory cell (CAM cell) which compares information stored in a storage node with inputted information and a semiconductor device including a CAM array which stores or compares information encoded in the device.

BACKGROUND OF THE INVENTION

As a result of explosive popularization of the Internet, the table scale required for a router and a switch in the network has been rapidly increasing, and the improvement of the search speed of the table has been demanded. For the achievement of this demand by means of hardware, ternary content addressable memory (TCAM) has attracted a lot of attention.

FIG. 19 schematically indicates the configuration of a router. In FIG. 19, an example comprised of a network interface NIF, a network processor NP, a search engine SE, a search table LUT, and a content memory CM is shown. The network interface NIF and the network processor NP are connected by a system bus SBS. The network processor NP and the search engine SE are connected by an internal bus IBS. The search engine SE and search table LUT are connected by a data bus DQ. Here, the search table LUT is TCAM and the content memory CM is a static random access memory (SRAM) or a dynamic random access memory (DRAM).

The router transfers a packet from the Internet network IPN via the network interface NIF. The network processor NP decodes and reconstructs the content of the received packet. For example, the destination Internet protocol address (IP address) read from the packet header is transferred to the search table LUT via the search engine SE. The search table LPT stores a plurality of destination IP addresses, and when the inputted destination IP addresses are stored, it generates the address for reading the information corresponding to the destination IP address from the content memory CM. The content memory CM stores route information necessary for packet transfer and port number of the router and outputs information corresponding to the address inputted via the content memory address bus CADD to the network processor NP via the content bus CBS and the search engine SE. The network processor NP reconstructs the header content based on the information and transfers a packet to the next relay point from the designated port.

IEEE Journal of Solid-state circuits, vol. 31, No. 11, November 1996, pp. 1601 to 1609 (non-patent document 1) describes the TCAM cell configuration in TCAM. FIG. 20 shows the cell configuration of FIG. 1 of the non-patent document 1. This cell comprises the following three circuit blocks. The first circuit block is a memory cell SMC31 which comprises NMOS transistors N311, N312, N313, and N314 and PMOS transistors P311 and P312 as is the case of so-called SRAM cell. The second circuit block is a memory cell SMC32 which comprises NMOS transistors N321, N322, N323, and N324 and PMOS transistors P321 and P322 like the memory cell SMC31. The third circuit block is a comparator circuit MUC which comprises NMOS transistors N331, N332, N333, N334, and N335. The memory cell SMC31 stores binary information of zero or one (0, 1) and the memory cell SMC32 stores the third information "X" which is so-called "don't care" state, respectively. The information described above can be written and read by selectively activating the word line WL31 or WL32 as is the case of the publicly known SRAM. In addition, the comparator circuit MUC carries out XNOR operation to compare the storage information with the input information.

As an example, the search operation when memory information is "1" is described below. In this case, assume that the storage node NT in memory cell SMC311 is driven by power supply voltage VDD and the storage node NB is driven by ground voltage VSS. In the case where the TCAM cell is not in the "don't care" state and the storage node DC in the memory cell SMC32 is driven by the power supply voltage VDD, the transistors N331, N335 in the comparator circuit MUC become conductive, respectively, and the transistor N332 is in the cut-off state. Under the condition as described above, when inputting information "1" after precharging the match line ML to the voltage higher than the ground voltage VSS, the bit line BLB of the bit lines BLT and BLB which are at the ground voltage VSS is driven by the power supply voltage VDD, and the transistor N334 in the comparator circuit MUC is brought into the conductive state. However, since the transistor N332 is in the cut-off state, the condition between the match line ML and the grounding electrode is kept open. Consequently, by discriminating the voltage of the match line ML held to the precharge voltage with a match line sense AMP (not illustrated), it is determined that the compared information is matched.

On the contrary, when inputting information "0", the bit line BLT of the bit lines BLT and BLB which are at the ground voltage VSS is driven by the power supply voltage VDD, and the transistor N333 in the comparator circuit MUC is brought into the conductive state. Consequently, since the match line ML and the ground electrode are short-circuited via the transistors N335, N331, and N333, the match line ML is discharged. That is, by discriminating voltage drop of the match line ML with the match line sense AMP, it is determined that the compared information is mismatched. Note that, when the TCAM cell in the drawing is in the "don't care" state, since the storage node DC in the memory cell SMC 32 is driven by the ground voltage VSS, the transistor N335 in the comparator circuit MUC is cut off. Consequently, since no current route is formed between the match line ML and the ground electrode, even if any information is inputted, the match line ML is held to the precharge voltage and it is forcibly determined that the compared information is matched.

In addition, even when the input information is the third information "X" which indicates the so-called "mask" state, since both bit lines BLT and BLB are held to the ground potential VSS, the transistors N333 and N334 in the comparator circuit MUC are cut off. Consequently, even if the memory cell SMC31 stores any information, since no current route is formed between the match line ML and the ground electrode, the match line ML is held to the precharge voltage and it is forcibly determined that the compared information is matched.

SUMMARY OF THE INVENTION

Prior to the present application, the inventors of the present invention examined an encoding system for entry or search keys and the memory array configuration in order to achieve CAM that solves the problems of capacity shortage and increased power consumption in TCAM. Here, in TCAM, it is common to use "entry" as a word that corresponds to the word popularly used in DRAM and SRAM. Since the entry is the term that indicates information stored in each word, hereinafter, the storage information is called the entry and the comparison information is called the search key in accordance with customary practice. With reference to FIG. 21 through FIG. 24, the content which has been examined while developing the present invention will be described. However, FIG. 21 through FIG. 24 were prepared by the inventors of the present application to describe the examined content and are not drawings which have been released to the public.

FIG. 21 shows an example of a data pattern of One-hot-spot block codes which are suitable for achieving the capacity increase and the reduction of power consumption of TCAM. In this case, relative to the combinations of information 0–3 (decimal system) (power set), examples of ternary notation and One-hot-spot block code notation are shown. The One-hot-spot block code is the code in which the bit corresponding to the information is activated to theoretical value '1' and a plurality of information can be expressed by one data pattern. Consequently, since it becomes possible to store continuing decimal information such as 1–2, 0–2, or 1–3, which have been impossible to express by the ternary notation, the capacity shortage which has been a problem in TCAM can be alleviated. Note that the information inputted as the entry or search key is formed not only by 2 bits but also by multiple bits. However, they are all encoded in units of 2 bits in accordance with FIG. 21.

FIG. 22 shows the memory array configuration prior to the invention in this application. This memory array forms a hierarchical structure in which the match line comprises the main match line MMLm (m=0, 1, . . . ) and the sub-match line SMLmj (m=0, 1 . . . ; j=0, 1, . . . ). The memory cells are disposed at intersections between a plurality of word lines WLm (m=0, 1, . . . ) and a plurality of bit lines BLni (n=0, 1 . . . ; i=0, 1, 2, 3), respectively. Each of the plurality of word lines is driven by the word driver block WDB and the plurality of bit lines are driven by the read/write circuit block RWB, respectively. To the bit lines BLni (n=0, 1, . . . , i=0, 1, 2, 3), a plurality of corresponding search lines SLni (n=0, 1, . . . ; =0, 1, 2, 3) are disposed in parallel, respectively. Each of the plurality of search lines is driven by the search driver block SDB. In addition, to the word lines WLm (m=0, 1, . . . ), a plurality of corresponding main match lines MMLm (m=0, 1, . . . ) are disposed in parallel, respectively.

Furthermore, a plurality of sub-match lines SMLmj (m=0, 1, . . . ; j=0, 1, . . . ) are disposed in parallel to corresponding main match lines MMLm (m=0, 1, . . . ), respectively, and connected via corresponding sub-match determination circuits SMDmj (m=0, 1, . . . ; j=0, 1, . . . ), respectively. To the sub-match line, for example, as is the case of the sub-match line SML01, four memory cells DMCi (i=0, 1, 2, 3) are connected, respectively. Here, the group comprising these four memory cells DMCi (i=0, 1, 2, 3) is called memory block MBmj (m=0, 1, . . . ; j=0, 1, . . . ), respectively. Each of the memory cells comprises three NMOS transistors T411, T412, and T413 and a capacitor C as shown in FIG. 23. The capacitor C is connected to plate voltage VPLT. Storage nodes N00 and N03 are formed from the gate of transistor T413, a terminal of transistor T411, and a terminal of the capacitor C.

In addition, the sub-match determination circuit comprises an NMOS transistor T421 for precharging the corresponding sub-match line and an NMOS transistor T422 for discriminating minute signals generated in the sub-match line in response to a signal of the pre-charge enable signal line PC. The NMOS transistor T421 is connected to the pre-charge voltage VPC. Furthermore, the, main-match determination circuit block MMDB of FIG. 22 comprises a plurality of main-match determination circuits MMDm (m=0, 1, . . . ) as shown in FIG. 23, which comprises an NNOS transistor T431 that drives the corresponding main match line, and a sense amplifier SA that discriminates comparison results in the entry on the corresponding main match line, and outputs the voltage hit signal (in this case, HIT0) that corresponds to the comparison results, in response to a signal from the search enable signal line SEB. The NMOS transistor T431 is connected to array voltage VDL.

The inventors of the present invention have further examined the input system for the entry and the search keys in CAM described above prior to the present invention. In particular, when the configuration of entry and search keys is examined in detail, the inventors have found that there are the following three problems. Before describing these problems, the configuration of entry and search keys will be described to aid in understanding.

FIG. 24 shows an example when the entry and search key comprise 144-bit signals. Hereinafter, the component elements of the entry and the search key are called regions, which are primarily prescribed in the OSI (Open Systems Interconnection) reference model standardized by ISO (International Organization for Standardization). Reference numeral 50 denotes the source IP address SIP region in the third layer (network layer), and is the 32-bit information. Reference numeral 51 denotes the destination IP address (DIP) region in the third layer (network layer), and is the 32-bit information similarly. Reference numeral 52 (IPPRT) denotes a protocol region of the fourth layer (transport layer), and is the 8-bit information.

The reference numeral 53 is the TOS (Type of service) region that indicates the service quality of the Internet protocol, and is the 8-bit information similarly. Numerical reference 54 denotes the source port number SPORT region in the fourth layer and is the 16-bit information. Reference numeral 55 denotes the destination port number DPORT region in the fourth layer and is the 16-bit information similarly. Reference numeral 56 denotes the UDT region which the user defines and indicates the added information, and in the drawing, an example of 23 bits is shown. Reference numeral 57 is a UFLG region that indicates in particular a plurality of flags of the information which the user added. In the drawing, examples of 9-bit information are shown in accordance with the 9 flags. Note that, in order to input as long as 144-bit information to the CAM, the technique is popularly adopted to suppress the mounting cost, in which the information is divided into two and then inputted as shown in the drawing and the number of pins of data bus is designated to, for example, 72.

Note that, when the One-hot-spot block code as described above is applied to the CAM which handles the entry and search key described above, the inventors have found out that the following three problems occur. The first problem lies in that a device called, for example, a network processor for controlling CAM is difficult to monitor the memory use condition in the CAM. That is, although the entry is stored in memory after encoding and compression are carried out in the CAM, it looks as if the input entry is arbitrarily rewritten in the CAM when seen from the outside of the CAM. Consequently, the CAM control device is unable to grasp the entry in which no information is written (hereinafter called the "empty entry"), which causes the problems in entry updating and adding operations. In addition, the method to aid the monitoring functions by adding the entry count signal group and outputting the information concerning the entry compressed and extended in the chip may be available, but the mounting cost is increased due to the increase of the number of data-bus pins. Therefore, it is desirable to leave the compression and extension operations to the CAM control device and to allow the CAM only to encode and decode signals corresponding to the compressed information.

The second problem lies in that the 1-bit information is difficult to be efficiently stored in memory. The abovementioned One-hot-spot block codes are suitable to collectively store a plurality of IP addresses in the IP address regions such as those denoted by reference numerals 50 and 51 in FIG. 24 and a plurality of port numbers in port number regions such as those denoted by reference numerals 54 and 55 of FIG. 24. However, in particular, when flags like the region 57 are encoded in accordance with the correspondence with the power set of the information 0–3 (decimal system) as shown in FIG. 21 and the One-hot-spot block code, only one flag can be stored in one memory block because the CAM has the memory cell blocked in units of 2 bits as shown in FIG. 22. That is, the information showing that a flag is stored (for example, information is 1) or not (for example, information is 0) or don't care (for example, the information may be either 0 or 1) can only be stored in one memory block. Consequently, the memory block of 144 bits or more per 1 word is required, and the memory use efficiency is decreased. Therefore, in order to store two flags in one memory block, it is desirable that the information that corresponds to the ternary notation is inputted to the CAM and then encoded.

The third problem is that since the long and large entry and search key are divided and then inputted as described in FIG. 24, an encoding circuit and a decoding circuit that can process information of various regions are required. That is, when the relevant low-order bits of the search key divided into two is seen in FIG. 24, there are the bits which process part of the destination IP address in one part and the bits which process the flag information on the other part, and the encoding circuit and the decoding circuit that can cope with both are required. Therefore, in order to satisfy the abovementioned contradicting requirements with the circuit scale suppressed, it is desirable to achieve the circuit configuration in which the encoding circuit and decoding circuit can be changed over in accordance with the information to be processed for each operation cycle.

According to the foregoing description, it is an object of the present invention to transmit and receive the information corresponding to the regions of entry and search key between CAM and CAM control device. In addition, it is another object of the present invention to improve the availability of CAM provided with the One-hot-spot block code by performing the encoding and decoding in accordance with various information in each operation cycle.

One of typical means of the present invention is described as follows. That is, in accordance with the regions of the storage information (entry) and input information (comparison information or search key), quaternary information with the minimum value and the difference set as a pair or ternary information with the data and mask set as a pair are used for I/O signals. In addition, two kinds of encoding circuits and decoding circuits are disposed in accordance with the foregoing two types of information, and either one of the encoding circuit and decoding circuit are activated in accordance with the value set to the registers which are arranged in order to designate the type of information in each region of the entry and search key. By selecting the desired register from the plurality of registers in accordance with external command signals and address signals, encoding and decoding in accordance with information to be processed are carried out.

In the CAM which stores the entry while compressing the same, monitoring of the memory use condition can be easily carried out as is the case of the conventional TCAM. In addition, it becomes possible to cope with entries and search keys with various configurations. Consequently, the availability of CAM which efficiently stores entries can be improved.

BRIEF DESCRIPTIONS OF THE DRAWINGS

FIG. 2 is an explanatory diagram showing an example of the mapping of I/O signals and codes in the write operation used in the content addressable memory of FIG. 1;

FIG. 20 is an explanatory diagram showing a conventional ternary content addressable memory cell comprised of 17 transistors;

FIG. 21 is an explanatory diagram showing the mapping of information processed in the content addressable memory to which the One-hot-spot block code is applied, which has been examined while developing the present invention;

DESCRIPTIONS OF THE PREFERRED EMBODIMENTS

Figure 1:
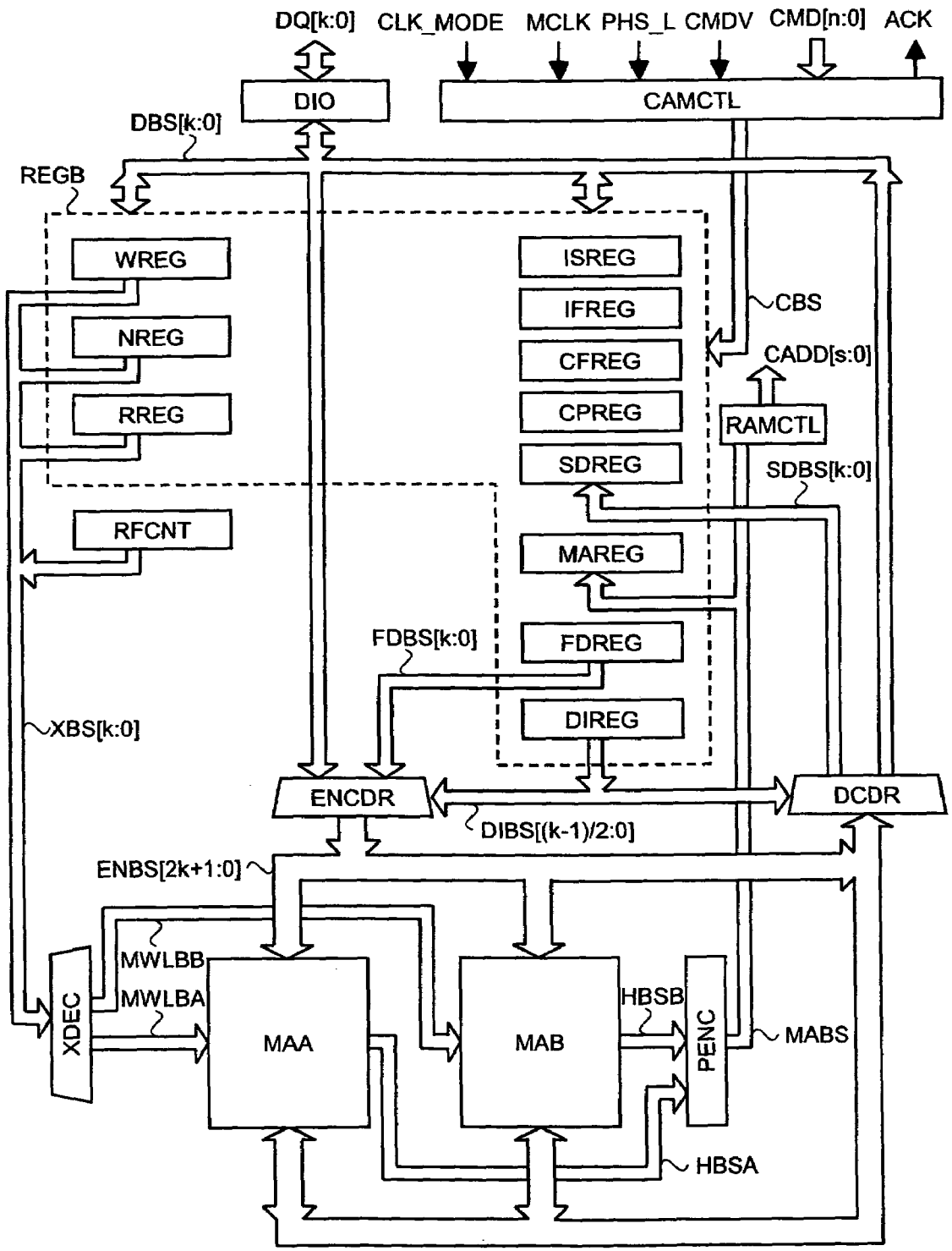
FIG. 1 is an explanatory diagram showing an example of basic configuration of principal block in a content addressable memory to which one-hot-spot block codes are applied.

Hereinafter, each embodiment according to the present invention will be described in detail with reference to the accompanying drawings. Circuit elements that comprise each block in the embodiments are not particularly limited. However, it is typically formed on one semiconductor substrate such as single-crystal silicon by the semiconductor integrated circuit technology such as publicly known CMOS (complimentary metal-oxide semiconductor), etc.

[First Embodiment]

(I/O Signal Mapping)

FIG. 2 shows an example of mapping of CAM I/O signal and One-hot-block code for the entry in the present invention with respect to the IP address region and the flag region, respectively. Although the detail will be described later, the I/O signals of this embodiment have the two features. The first feature is to use the binary information concerning the minimum value of each entry and the difference as the I/O signal in such an IP address region that a plurality of information is collectively stored. The second feature is that the data and the binary information concerning the mask are used as I/O signals similar to the conventional TCAM in the region as represented by the flag region whose range is never specified like the IP address.

First of all, I/O signals of the IP address region will be described. In FIG. 2, for the simplification, mapping of 2-bit I/O signals is shown for the case of 0–3 (decimal system) combinations. More concretely, the minimum value and the difference are assigned with the 2-bit binary value for the single value (0, 1, 2, 3) and continuous value (0–1, 0–2, 0–3, etc.). The remaining combinations are the conditions in which no storage information is written, that is, the initial condition, or cluster of discrete values which are not used for the storage of IP address whose range is designated. However, combinations of remaining binary values are appropriately assigned to these combinations. Since the terms of minimum value and difference do not mean anything for these remaining combinations, the I/O signal patterns are bracketed off in FIG. 2.

Note that, when representing each of 0 to 3 (decimal systems) by '01', '02', '10', '20' in order of smaller numbers, respectively, combinations other than the initial state can be expressed by the additions of them. That is, combinations of 0 to 3 (decimal systems) can be represented by two-digit symbols with 0 to 3 combined. Therefore, the relationship between I/O signal and One-hot-spot block code for the IP address region as shown in FIG. 2 is called "encoding mapping of 4-value information" for convenience sake in the following embodiments.

Next, the I/O signal of the flag region will be described. In this case, as described above, encoding of the information in conformity to the conventional TCAM is carried out. Therefore, the relationship between the I/O signal and the One-hot-spot block code for the flag region as shown in FIG. 2 is called the "encoding mapping of 3-value information" for convenience sake in the following embodiments. In FIG. 2, an example in which the logical value of "Don't care" or bit mask which serves as a local mask is set to '0' is shown. In this case, the logical sign 'Z' in the data denotes an undefined value, indicating that the logical value may be either 'one' or 'zero.'

Figure 3:
FIG. 3 is an explanatory diagram showing an example of the mapping of I/O signals and codes in the read operation used in the content addressable memory of FIG. 1.

In FIG. 3, an example of mapping of the CAM input signal and One-hot-block code for search key according to the present invention is shown with respect to the IP address region and the flag region, respectively. There are two differences as compared to FIG. 2. The first difference is that mapping to the initial condition is deleted. The reason is that absence of combinations of information in the search operation is equal to inputting no search key. The second difference lies in that two-continuous value and three-continuous value mappings are deleted in the IP address region. The reason is that there is only one IP address designated for each packet and there is no other way than to search or not to search this. Others are the same mappings as those of FIG. 2.

By the foregoing mapping, the following two effects can be obtained. The first effect is that this can build the one-to-one relationship between the I/O signal of the CAM and the signal encoded in the CAM. As a result, since the CAM control device can accurately grasp the number of entries, monitoring of memory use condition can be facilitated. The second effect is that it becomes possible to use common I/O signals for the entry and the search key. As a result, the common use of the encoding circuit and decoding circuit described later can be achieved and the CAM chip area can be reduced.

Note that it can be easily understood from the foregoing description that the entry can be efficiently stored in a memory block by configuring the entry and the search key in such a manner that the boundary of the IP address region coincides with the boundary of the memory block. In addition, in the foregoing description, the quaternary information encoding mapping is used for the IP address region. However, it is not limited to this and can be applied to other regions. For example, it is possible to apply it to the port region in which a plurality of port numbers are stored. Also in this case, the same effects as is the case of the IP address region can be obtained.

Figure 24:
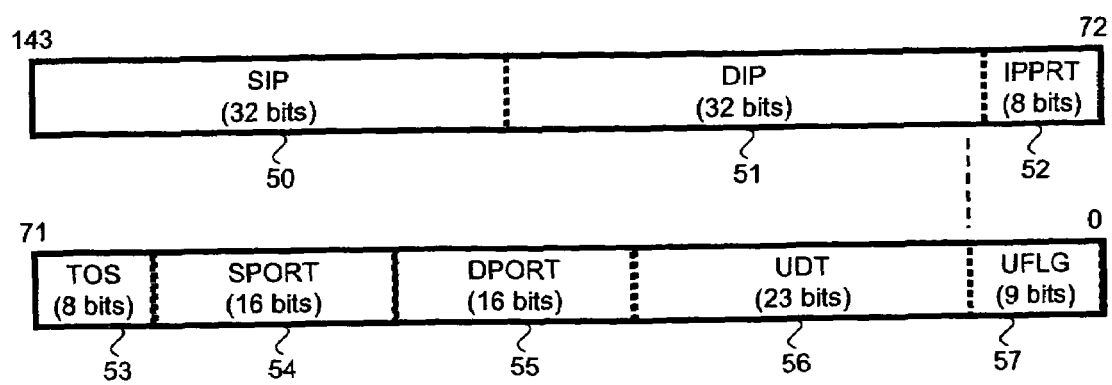
FIG. 24 is an explanatory diagram schematically showing the configuration examples of entry and search keys examined while developing the present invention.

Lastly, some additional description is made for the mapping in this embodiment. The IP address region in the Internet protocol version 4 (IPv4) has a 32-bit width as shown in FIG. 24. Consequently, the I/O signals in the IP address region are the minimum value and the difference as viewed from the whole 32 bits, and the encoding of them into blocks in units of 2 bits can be easily understood by the following description. For a simple example, in the case of information 12–14 (decimal system), the minimum value is 12 ('1100' in the binary value) and the difference is 2 ('0010' in the binary notation). Since the encoding of the high-order 2 bits in accordance with FIG. 2 results in 1000 and the encoding of the low-order 2 results in 0111, the One-hot-spot block code '1000_0111' can be obtained.

(Whole Configuration of CAM)

Figure 22:
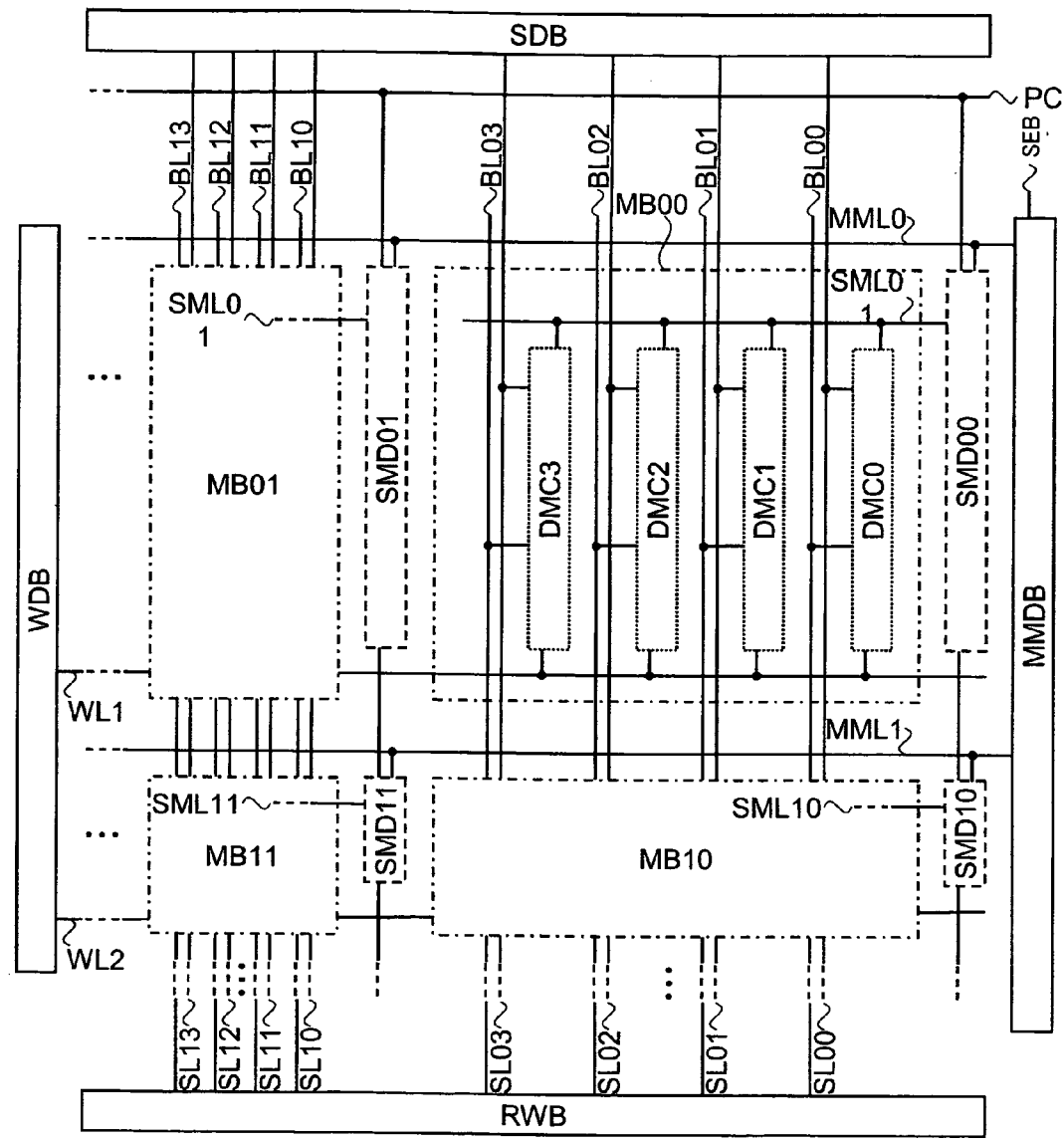
FIG. 22 is an explanatory diagram showing an example of the memory array configuration using a hierarchical match line structure in the content addressable memory to which the One-hot-spot block code is applied, which has been examined while developing the present invention.
Figure 23:
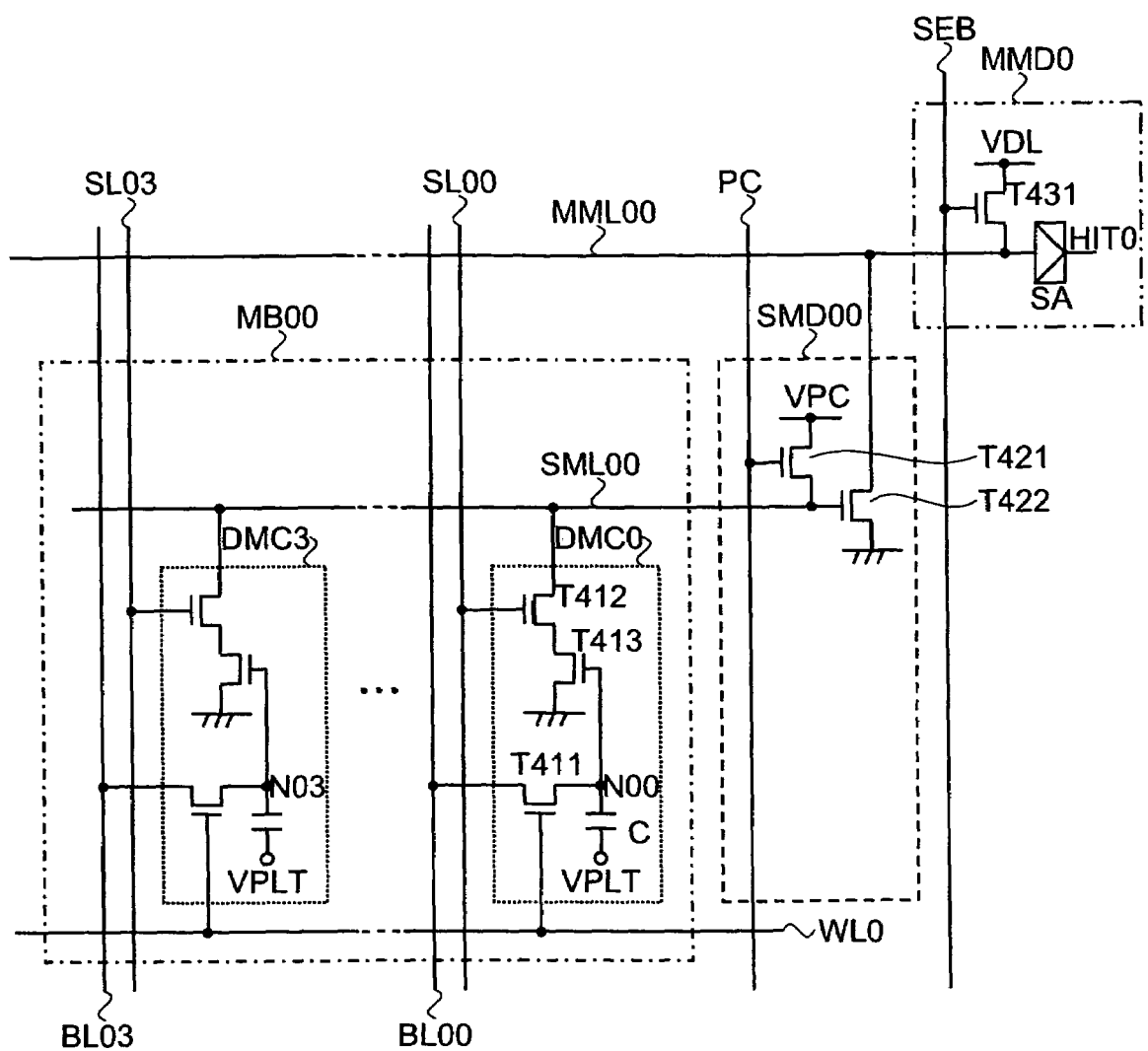
FIG. 23 is an explanatory diagram showing a specific example of the configuration of a circuit block in the memory array of FIG. 22.

Next, the whole configuration of the CAM based on the I/O signal mapping will be described with reference to FIG. 1 and FIG. 4. FIG. 1 is a drawing showing the basic configuration of the principal block of CAM. This configuration comprises memory arrays MAA and MAB, a data I/O circuit DIO, a various register block REGB, a CAM control circuit CAMCTL, a refresh counter RFCNT, a low decoder XDEC, an encoding circuit ENCDR, a decoding circuit DCDR, a priority encoder PENC, and a RAM control circuit RAMCTL. The memory arrays MAA and MAB have the configurations as shown in FIG. 22 and FIG. 23. The data I/O circuit DIO is disposed between the data bus DQ and the data bus inside the chip DBS, and receives and transmits the address signals and data, as well as the control signals that define the various settings of chips.

The various kinds of registers are configured by multiple bits of registers in accordance with the number of signal lines (here, k+1) of the data bus DQ. In FIG. 1, as a register that transmits and receives the address signals via the internal data bus DBS, three registers, namely, a burst write register WREG, a next free address register NREG, and a burst read register RREG are shown. The first burst write register WREG stores the first cycle low address and burst length in the burst write operation, and when the burst write operation begins, it generates addresses of the second and latter cycles while counting up.

The second next free address register NREG stores the empty entry low address. The third burst read register RREG stores the first cycle low address and the burst length, and when the burst read operation begins, it generates the address of the second and latter cycle while counting up. The address signal generated by these registers is inputted to the low decoder XDEC via the low address bus XBS, and the decoded results are inputted to the memory array MAA and MAB via the main word line groups MWLBA and MWLBB, respectively. In addition, the decoded data is outputted to the outside of the chip via the internal data bus DBS and the data I/O circuit DIO.

In FIG. 1, as registers which receive control signals via the internal data bus DBS, four registers, namely, an instruction register ISREG, an information register IFREG, a configuration register CFREG, and an information identification register DIREG are shown. The first instruction register ISREG stores the control signal inputted via the internal data bus DBS and defines the chip initialization method, the number of chips of CAM connected longitudinally and continuously, and the table configuration in the chip. In this case, the table configuration means the logical memory array configuration in accordance with the number of entries and the amount of information. For example, in the case where data widths of the memory arrays MAA and MAB are 72 bits and the amount of information of the entry is 72 bits (=k+1 bits, k=71. (k+1) shows the data bus width), the entry is inputted in the memory array MAA or MAB.

In this case, the first instruction register ISREG is set to a value to which continuous low addresses are assigned through two memory arrays. Consequently, by two memory arrays MAA and MAB, the internal circuit is set in such a manner that the memory array has 72-bit width and the number of words is doubled, and different decode signals are inputted via the above-mentioned main word line groups MWLBA and MWLBB. In still another example, in the case where the data widths of the memory arrays MAA and MAB are 72 bits and the amount of information of the entry is 144 bits as shown in FIG. 24 (=2×(k+1) bits, k=71. (k+1) indicates the data bus width), the entry is encoded after divided into 72 bits (=(k+1) bits, k=71), and then inputted to the memory MAA and MAB, respectively. In such a case, the first instruction register ISREG is set to a value to which a low address common to both memory arrays is assigned.

Consequently, the internal circuit is set in such a manner that the 144-bit wide memory arrays are achieved with the two memory arrays MAA and MAB, and the same decode signal is inputted via the above-mentioned main word line groups MWLBA and MWLBB. The second information register IFREG stores a device number specific to the chip assigned to a system such as router. The third configuration register CFREG stores, for example, signals to control the activation of memory arrays MAA and MAB logically divided as described above. The fourth information identification register DIREG stores the identification information that distinguishes the type of information which is processed by the CAM according to this embodiment. That is, the information that indicates whether the encoding and decoding in accordance with the quaternary information mapping are carried out or the encoding and decoding in accordance with the ternary information mapping are carried out as shown in FIG. 2 and FIG. 3 is stored in compliance with the information of the region to be processed with the relevant bits.

This register setting value is inputted to the encoding circuit and the decoding circuit described later via the identification information bus DIBS in units of encoding blocks. Note that, since the encoding circuit and the decoding circuit are switched over in units of 2 bits of the encoding block, the bus width of identification information bus DIBS is (k+1)/2 bits. In addition, the values of the four registers described above are set to the desired values when chip power supply is turned on or in compliance with the switch of the operation mode.

Furthermore, in FIG. 1, as a register to receive data via the internal data bus DBS, three registers, namely, the Comparand register CPREG, the first cycle data register FDREG, and the second cycle data register SDREG are shown. The first Comparand register CPREG stores the search key (or comparison information) inputted by the search operation. The search key stored in this case is written to the memory arrays MAA and MAB via the encoding circuit described later when there is no entry that coincides in the search operation. The second first cycle data register FDREG temporarily stores the difference and mask shown in FIG. 2 and FIG. 3 and transmits the difference and mask to the encoding circuit described later via the first cycle data bus FDBS.

The third second cycle data register SDREG temporarily stores the difference and the mask shown in FIG. 2 and FIG. 3 of the information obtained from the entry read from memory arrays MAA and MAB via the later described decoding circuit and the second cycle data bus SDBS[k:0], and transmits the difference and mask to the data I/O circuit DIO via the internal data bus DBS.

In FIG. 1, in addition to these, the match address registers MAREG inserted between the match address bus MABS described later and the internal data bus DBS are shown. Note that various kinds of registers described above suitably comprise a plurality of register blocks of the same configuration and specifications, and the desired registers are selected by the command signal groups described later and the address signals.

The CAM control circuit CAMCTL outputs internal control signals generated in response to the external command signal group CMD comprising a clock mode signal CLK-MODE inputted from the chip outside, a master clock MCLK, a phase signal PHS_L, a command valid signal CMDV, and a plurality of ((n+1) pieces in this case) signals to the internal command bus CBS, and it also outputs a read acknowledge signal ACK to the chip outside. The clock mode signal CLK_MODE is a signal to select the frequency of the master clock MCLK. The master clock MCLK can adopt two kinds of frequency, and for example, when the clock mode signal CLK_MODE is on the high level, the cycle clock twice as large as the phase signal PHS_L is received.

Adversely to this, when the clock mode signal CLK_MODE is on the low level, the cycle clock equal to the phase signal PHS_L is received. The command valid signal CMDV shows the effectiveness of the external command signal group CMD. The external command signal group CMD is the signal generated in the CMD control device described above, and the CAM operation condition is defined in response to the signals on the internal command bus CBS generated via the CAM control circuit CAMCTL and a register in accordance with the operation is selected from various kinds of registers described above. For example, CAM operation is defined as follows. That is, when CMD[1:0]=00 (n≧1), the read operation is performed, when CMD[1:0]=01, the write operation is performed, when CMD[1:0]=10, the search operation is performed, and when CMD[1:0]=11, the entry updating operation is performed. The read acknowledge signal ACK is a strobe signal outputted in synchronization with the read data read during the read operation.

The refresh counter RFCNT generates low address in compliance with the refresh operation. This address is inputted to the low decoder XDEC via the low address bus XBS.

The encoding circuit ENCDR receives the information (difference and mask in this case) obtained from the first cycle data register FDREG via the first cycle data bus FDBS and the information (minimum value and data in this case) inputted via the internal data bus DBS as described above and encodes the entry or search key into the One-hot-spot block. In this case, when encoding is carried out in units of 2 bits, the encoding signal of 2×(k+1) bits are inputted to the memory arrays MAA and MAB via the encoding data bus ENBS.

The decoding circuit DCDR receives the entry read from the memory arrays MAA and MAB via the encoding data bus ENBS, and converts them into a pair of the minimum value and the difference or a pair of data and a mask as shown in FIG. 2. Then, the minimum value and the data are transferred to the data I/O circuit DIO via the internal data bus DBS and the difference and the mask are transferred to the second cycle data register SDREG via the encoding data bus DCBS[k:0], respectively.

The priority encoder PENC generates the address signal that corresponds to the entry that coincides with the search key in response to the signal which is inputted from the hit signal buses HBSA and HBSB and comprised of the hit signal HITO of FIG. 23 in the search operation. Note that, in the case where there are a plurality of matched entries, the priority encoder outputs the address signals sequentially from the address signals that correspond to the most significant entry (for example, row having the least number of corresponding low address). The generated address signal is inputted to the above-mentioned match address register MAREG via the match address bus MABS.

The RAM control circuit RAMCTL outputs the content address received via the match address bus MABS to DRAM (dynamic random access memory) or SRAM (static random access memory). In FIG. 1, as one example, the configuration to output the content address to the chip outside via the content address signal group CADD[S:0] is shown. In this case, reference character s denotes an integer that is defined in accordance with the memory array configuration of the CAM according to this embodiment.

Note that the component elements which form the CAM according to this embodiment include not only the circuit blocks and signals described in FIG. 1 but also various element blocks and signals. For example, a phase locked loop PLL and a delay locked loop DLL for adjusting the phase of the internal clock, a test circuit, a controller for controlling cascade-connected chips, a RAM clock that controls an externally mounted content memory, RAM control signal groups and the like are provided. However, the illustrations thereof are omitted for the simplification in FIG. 1.

Figure 4:
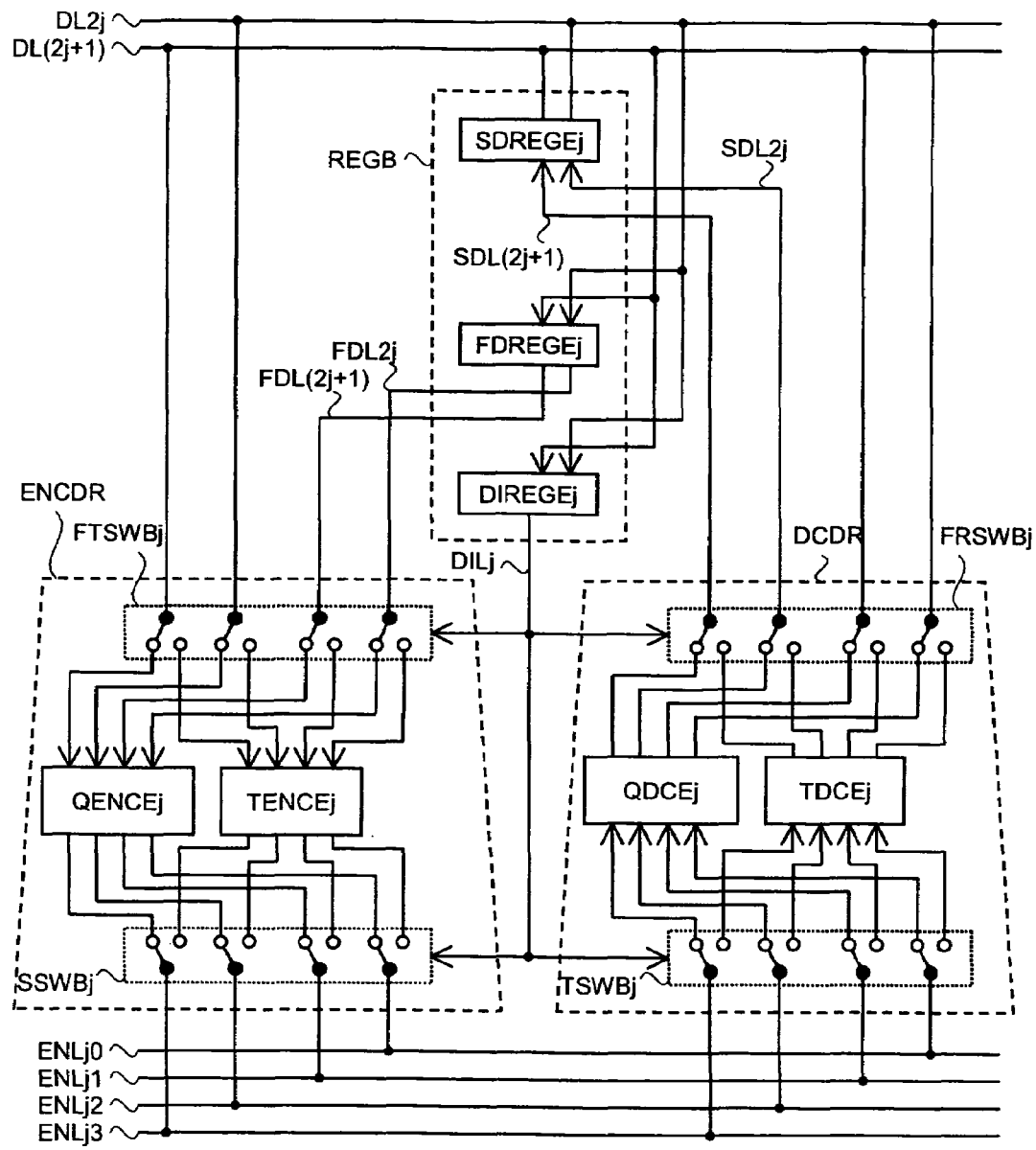
FIG. 4 is a detailed explanatory diagram showing another example of configuration of the encoding circuit and the decoding circuit, and the various register block in the content addressable memory of FIG. 1.

In order to simplify the description, FIG. 4 shows circuit block configuration of 2 bits, which is an encoding block unit, with respect to the component elements related to the data transmission and reception in FIG. 1. The index 'j' of the symbols shown below denotes any of 0, 1, ..., (k−1)/2 ('k' is an odd number). In FIG. 4, as the component elements of the various register block REGB, an information identification register element block DIREGEj, a first cycle data register element block FDREGEj, and a second cycle data register element block SDREGEj are shown. The settings of these registers are carried out via internal data lines DL2j and DL(2j+1), which are component elements of the internal data bus. Note that the information identification register element block DIREGEj comprises a plurality of register blocks and the register values can be set to desirable values. In addition, registers which are selected in response to the signal of the internal command bus CBS which are omitted in FIG. 4 are described above with reference to FIG. 1.

The encoding circuit ENCDR comprises a quaternary encoding circuit element block QENCEj, a ternary encoding circuit element block TENCEj, a first switch block FTSWBj, and a second switch block SSWBj. The quaternary encoding circuit element block QENCEj is used for encoding the IP address region shown in FIG. 2 and FIG. 3. In addition, the ternary encoding circuit element block TENCEj is used for encoding the flag region. The first switch block FTSWBj comprises four two-way switches, and connects the internal data lines DL2j and DL(2j+1) and the output signal lines of the first cycle data register element block FDREGEj, that is, the first cycle data lines FDL2j and FDL(2j+1) which are the component elements of the first cycle data bus FDBS[k:0] to either of the quaternary encoding circuit element block QENCEj or the ternary encoding circuit element block TENCEj in accordance with the output signal of the information identification register element block DIREGEj, that is, the voltage level of the information identification line DILj, which is a component element of the identification information bus DIBS[(K−1)/2:0].

For example, in the case where two-bit encoding in the IP address region is carried out in the relevant element blocks, the value of the information identification register element block DIREGEj is set to '11' to make the information identification line DILj be in the high level. By doing so, the internal data lines DL2j and DL(2j+1) and the first cycle data lines FDL2j and FDL(2j+1) which are output signal lines of the first cycle data register element block FDREGEj are connected to the quaternary encoding circuit element block QENCEj, respectively. Alternatively, in the case where 2-bit encoding of the flag region is carried out in the relevant element block, the value of the information identification register element block DIREGEj value is set to '00' to make the information identification line DILj be in the low level. By doing so, the internal data lines DL2j and DL(2j+1) and the first cycle data lines FDL2j and FDL(2j+1) which are output signal lines of the first cycle data register element block FDREGEj to the ternary encoding circuit element block TENCEj, respectively. The second switch block SSWBj similarly comprises four two-way switches, and connects the encoding data lines ENLj0 to ENLj3 which are component elements of the encoding data bus ENBS to the quaternary encoding circuit element block QENCEj or the ternary encoding circuit element block TENCEj, respectively, in accordance with the information identification line DILj which is output signal of the information identification register element block DIREGEj.

The decoding circuit DCDR comprises the quaternary decoding circuit element block QDCEj, the ternary decoding circuit element block TDCEj, the third switch block TSWBj, and the fourth switch block FRSWBj. The quaternary decoding circuit element block QDCEj is used for decoding the IP address region shown in FIG. 2. In addition, the ternary decoding circuit element block TDCEj is used for decoding the flag region. The third switch block TSWBj comprises four two-way switches, and connects the encoding data lines ENLj0 to ENLj3 to the quaternary decoding circuit element block QDCEj or the ternary decoding circuit element block TDCEj, respectively, in accordance with the information identification line DILj which is the output signal of the information identification register element block DIREGEj.

For example, in the case where two-bit decoding in the IP address region is carried out in the relevant element blocks, the value of the information identification register element block DIREGEj is set to '11' to make the information identification line DILj be in the high level. By doing so, the encoding data line ENLj0 to ENLj3, which are component elements of the encoding data bus ENBS, are connected to the quaternary decoding circuit element block QDCEj, respectively. Alternatively, in the case where the 2-bit decoding of the flag region is carried out in the relevant element block, the value of the information identification register element block DIREGEj is set to '00' to make the information identification line DILj be in the low level. By doing so, the encoding data lines ENLj0 to ENLj3 which are component elements of the encoding data bus ENBS to the ternary decoding circuit element block TDCEj, respectively. The fourth switch block FRSWBj similarly comprises four two-way switches, and connects internal data lines DL2j and DL(2j+1) and the input signal lines of the second cycle data lines of the second cycle data register element block SDREGEj, that is, the second cycle data lines SDL2j and SDL(2j+1) which are component elements of the second cycle data bus SDBS[k:0] to the quaternary decoding circuit element block QDCEj or the ternary decoding circuit element block TDCEj, respectively.

Note that, in FIG. 4, the first switch block to the fourth switch block comprising two-way switches are shown as an example for the sake of convenience. However, in actual, the same functions are achieved with using the publicly known MOS transistors.

Figure 5:
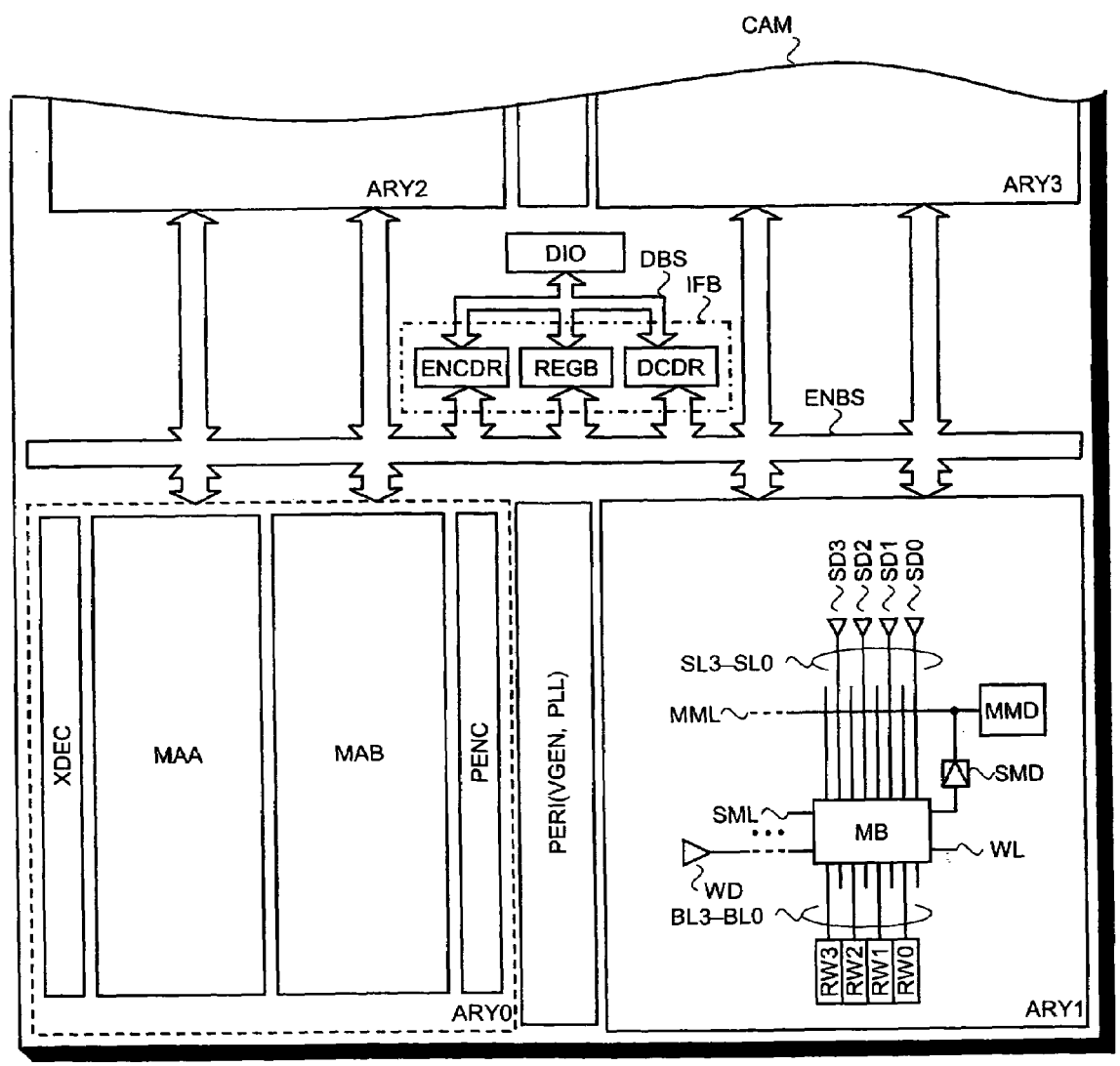
FIG. 5 is an explanatory diagram showing an example of a floor plan based on the basic configuration in the content addressable memory of FIG. 1.

Next, the floor plan of the above-mentioned CAM will be described. FIG. 5 shows an example of the floor plan with attention placed on the transmission and reception routes of the entry and the search key. In FIG. 5, the memory array blocks ARY0 to ARY3 comprise the memory arrays MAA and MAB of FIG. 1, respectively, as shown in the memory array block ARY0. The memory arrays MAA and MAB comprise, as shown in the memory array block ARY1, memory blocks MB disposed at the intersections of the word line WL and a plurality of bit lines (four bit lines BL0 to BL3 in this case) shown in FIG. 22 or FIG. 23, the word driver WD that drives the word line WL, the read/write circuits RW0 to RW3 that drive the corresponding bit lines BL0 to BL3, respectively, the search lines SL0 to SL3 disposed in parallel to the corresponding bit lines BL0 to BL3, the search drivers SD0 to SD3 that drive the corresponding search lines SL0 to SL3, the sub-match line SML in which signals in accordance with the comparison operations in the memory block are generated, the main match line MML disposed in parallel to the word line WL, the sub-match determination circuit SMD that discriminates signals generated in the sub-match line and drives the main match line in accordance with the result, the main match determination circuit MMD that discriminates signals generated in the main match line MML, and the like.

In addition, DI0 denotes an I/O circuit, which transmits and receives information to and from the chip outside. The value of various register blocks REGB is set or read via the internal data bus DBS. Note that, in FIG. 5, connections between the various register block and the CAM internal block are omitted for the simplification of the description, but it can be easily understood from the foregoing description that related circuit blocks are connected to one another. The information inputted in the chip (in this case, entry and search key) is converted from the internal data bus DBS to One-hot-block code via the encoding circuit ENCDR as described above, and transferred to each of the memory array blocks ARY0 to ARY3 via the encoding data bus ENBS. Contrary to this, information (entry in this case) read from each of the memory array blocks ARY0 to ARY3 is converted to the minimum value and data or the difference and mask from the encoding data bus ENBS via the decoding circuit DCDR, and outputted to the chip outside from the internal data bus DBS via the I/O circuit.

In addition, a peripheral circuit PERI such as an internal voltage generator circuit VGER and a PLL circuit PLL is disposed between memory arrays ARY0 and ARY1 and between memory arrays ARY2 and ARY3, and an encoding data bus ENBS and an I/O circuit DI0 are disposed between memory arrays ARY0 and ARY2 and between memory arrays ARY1 and ARY3. In this way, each of the memory array blocks ARY0 to ARY3 is divided by the cruciform region in which the peripheral circuit PERI or the I/O circuit DI0 are disposed. Here, the various register block REGB, the encoding circuit ENCDR, and the decoding circuit DCDR are provided at the intersection areas of the cruciform regions.

As described above, the CAM according to this floor plan can reduce the chip area because the various register block REGB, the encoding circuit ENCDR, and decoding circuit DCDR can be shared by a plurality of memory array blocks. In addition, since the memory array blocks are by cruciform regions and the circuits shared by a plurality of memory array blocks are provided at their intersection areas, it becomes possible to make the delay time of signal lines almost equal. Next, the operation of the CAM according to the above-mentioned configuration will be described.

(Write Operation)

Figure 6:
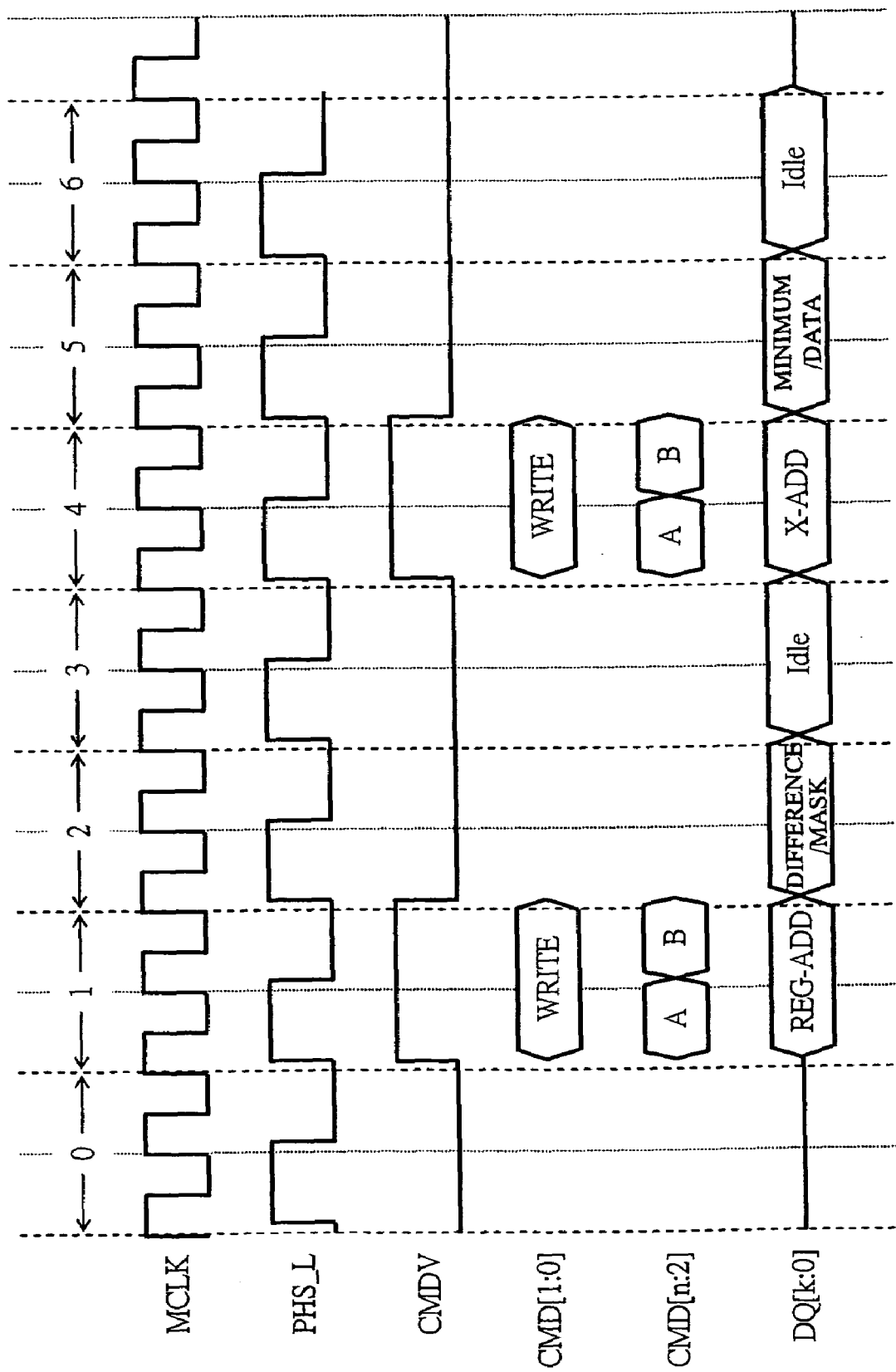
FIG. 6 is an explanatory diagram showing an example of the operation timing when an entry is written in the content addressable memory of FIG. 1.

FIG. 6 shows a timing chart of a write operation of the CAM in this embodiment. In FIG. 6, the case where the master clock MCLK frequency is double of the phase signal PHS_L is shown. However, in the following description on the operation, the number of cycles will be counted in accordance with the phase signal PHS_L. Assuming that the 2(k+1) bit entry is registered to CAM, the operation of FIG. 6 corresponds to the operation of writing the half region of this entry in either of the memory array MAA or MAB shown in FIG. 1. The feature of this operation lies in the point that the operation to write the difference and the mask in the first cycle data register and the operation to encode the minimum value and the data in accordance with the difference and the mask inputted in advance and then write them in the memory array are carried out in 3 cycles, respectively. Note that the information identification register shown in FIG. 1 is set in advance to the value suitable for the format of the information to be processed.

First of all, the difference and the mask are inputted into the first cycle data register in the following manner.

First half of the first cycle (1A cycle): The command valid signal CMDV which is brought to the low level is driven to the high level and at the same time, the write command is inputted by using the command signal group CMD[1:0]. In addition, by setting the command signal group CMD[n:2] to the desired value, the first cycle data register FDREG is selected from the various register block REGB, and a part of the address of the external content memory used together with the CAM of this embodiment is inputted. Furthermore, an address REG-ADD to select the desired register from the first cycle data register FDREG is inputted via the data bus DQ[k:0].

Latter half of the first cycle (1B cycle): Following the 1A cycle, the write command is inputted and the first cycle data register FDREG is selected.

Second cycle: As soon as the command valid signal CMDV which is kept to the high level is driven to be in the low level, the difference and the mask are inputted via the data bus DQ[k:0]. These pieces of information are written to the first cycle data register FDREG selected in the first cycle.

Third cycle: It is a wait state. Inside the CAM, the write operation to the first cycle data register FDREG is completed by the end of this cycle.

Now, the minimum value and the data are inputted in the following manner.

First half of the fourth cycle (4A cycle): As soon as the command valid signal CMDV which has been held to the low level is brought to the high level, the write command is inputted by using the command signal group CMD[1:0]. In addition, by setting the command signal group CMD[n:2] to the desired value, the first cycle data register in which the difference and the mask are written in the second cycle and the information identification register DIREG set to the value suitable for the format of the information to be inputted are selected, and a part of the address of the external content memory used together with the CAM of this embodiment is inputted. Furthermore, the low address X-ADD to select the word in which the entry is written is inputted via the data bus DQ[k:0]. This low address is decoded by the low decoder XDEC shown in FIG. 1 and thereafter the word line at the write destination is activated.

Latter half of the fourth cycle (4B cycle): Following the 4A cycle, the write command is inputted.

Fifth cycle: The minimum value and the data are inputted via the data bus DQ[k:0]. These pieces of information are converted into the corresponding One-hot-spot block codes by the encoding circuit selected by the information identification register DIREG together with the difference and the mask inputted in the second cycle and transferred to the memory array.

Sixth cycle: It is a wait state. The write operation to the memory array is completed by the end of this cycle.

Note that the setting of various registers of FIG. 1 is carried out in the manner similar to the operations of the first to third cycles of FIG. 6. In addition, the memory cell is initialized by inputting the minimum value: '11' and the difference '11' in the quaternary information of FIG. 2.

(Read Operation)

Figure 7A:
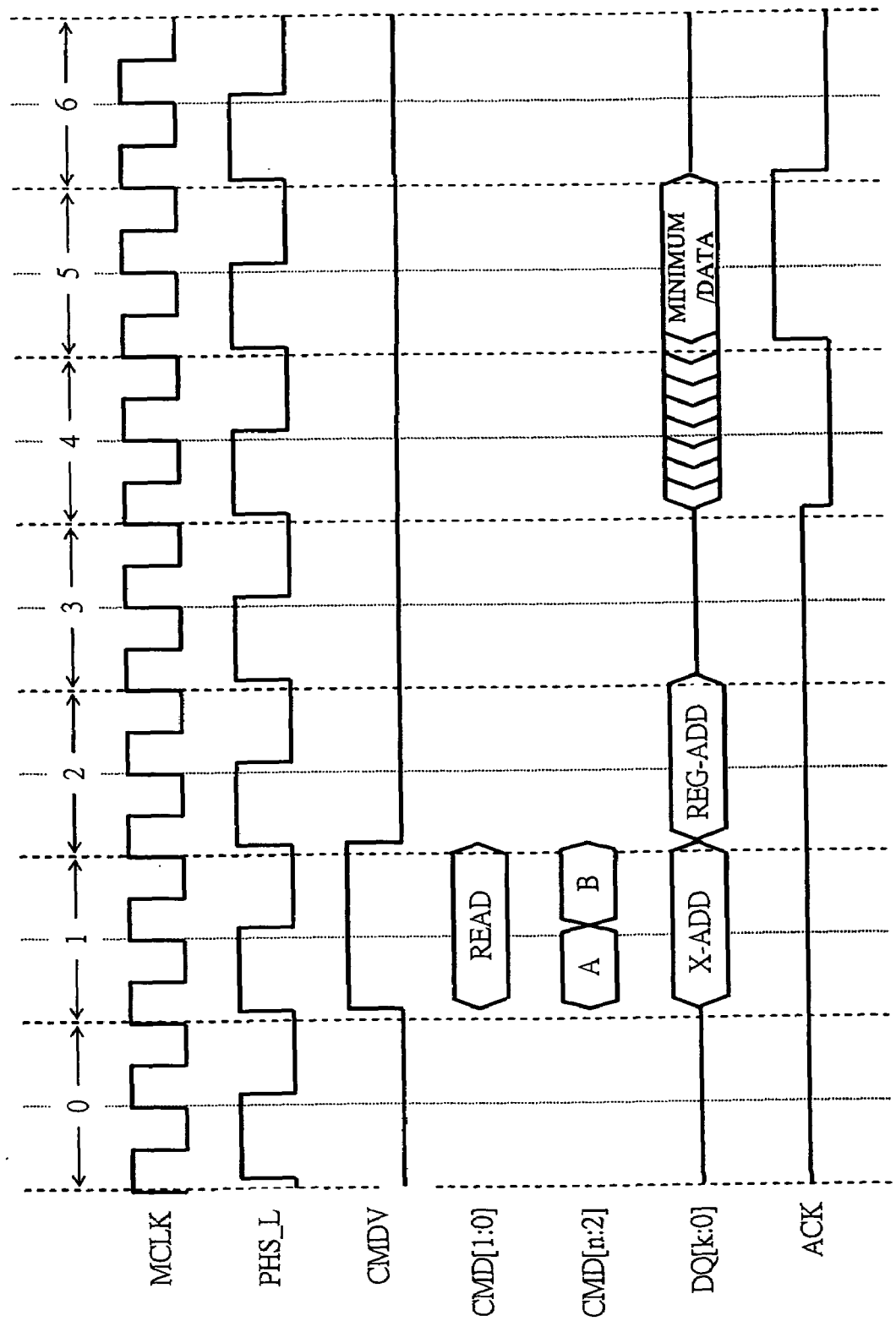
FIG. 7 is an explanatory diagram showing the first half cycle of the operation timing example when an entry is read in the content addressable memory of FIG. 1.
Figure 7B:
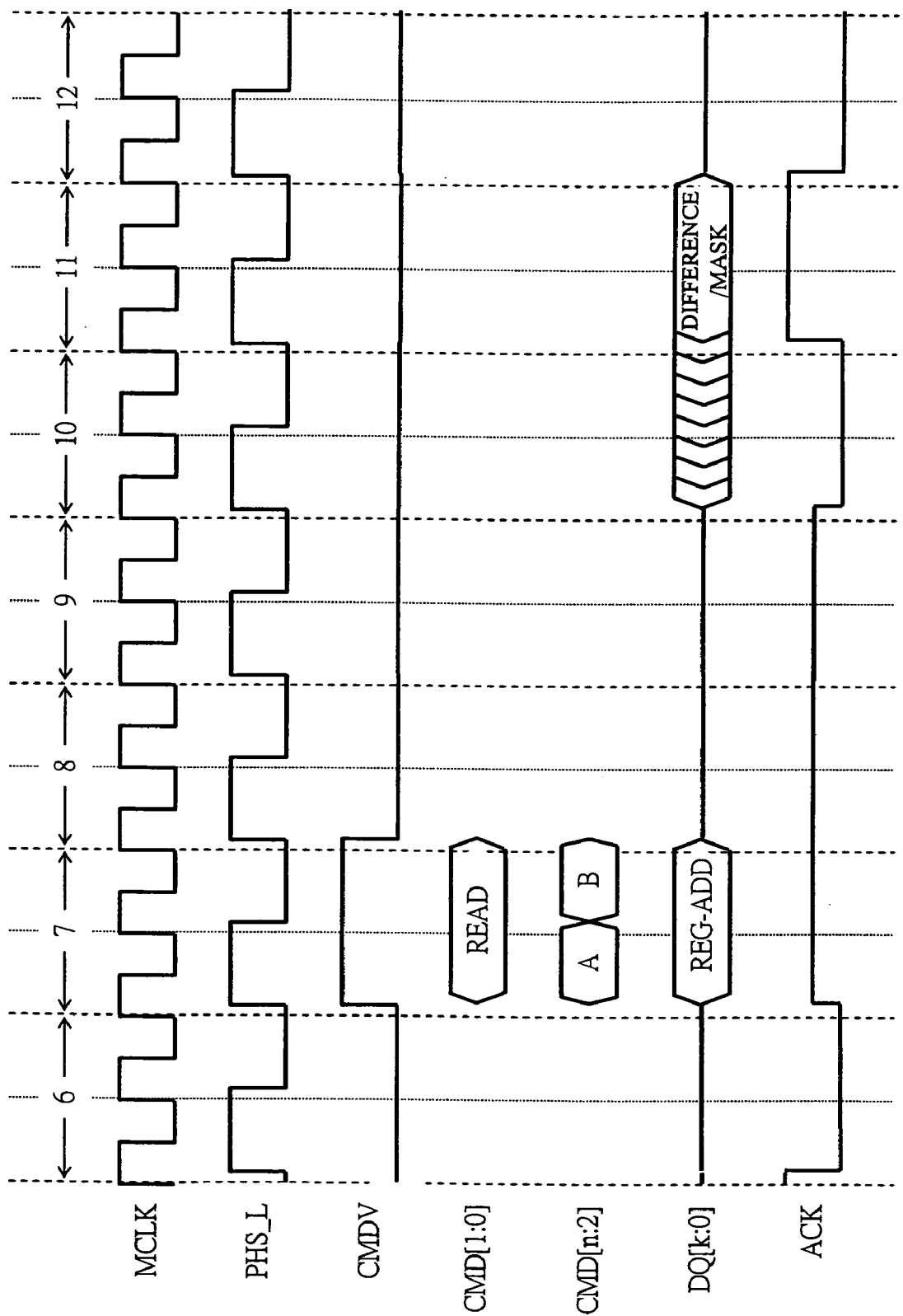

FIG. 7 shows timing charts of the read operation of the CAM in this embodiment. For convenience sake, the drawing is divided into 7A and 7B. However, FIGS. 7A and 7B show a continuous cycle. In FIG. 7, the case where the master clock MCLK frequency is double of the phase signal PHS_L is shown. However, in the following description on the operation, the number of cycles will be counted in accordance with the phase signal PHS_L. Assuming that the 2(k+1) bit entry is registered to the CAM, the operation of FIG. 7 corresponds to the operation of reading the half region of this entry from either of the memory array MAA or MAB shown in FIG. 1. The feature of this operation lies in the point that, after the entry read from the memory array is decoded, the minimum value and the data are outputted while the difference and the mask are temporarily stored in the second cycle data register, and thereafter, the address is re-inputted to output the difference and the mask. Note that the information identification register shown in FIG. 1 is set in advance to the value suitable for the format of the information to be processed.

First half of the first cycle (1A cycle): The command valid signal CMDV which is brought to the low level is driven to the high level and at the same time, the read command is inputted by using the command signal group CMD[1:0]. In addition, by setting the command signal group CMD[n:2] to the desired value, the second cycle data register SDREG and the information identification register DIREG set to the value suitable for the format of the information to be read from now are selected from the various register block REGB shown in FIG. 1, and a part of the address of the external content memory used together with this embodiment is inputted. Furthermore, the low address X-ADD to select the word to read the entry is inputted via the data bus DQ[k:0]. This low address is decoded by the low decoder XDEC shown in FIG. 1. Thereafter, the word line is activated, the entry which is encoded to the One-hot-spot block is read from the memory cell, and converted to the minimum value and the data and to the difference and the mask in the decoding circuit.

Latter half of the first cycle (1B cycle): Following the 1A cycle, the input of the read command and the selection of the second cycle data register SDREG are continued.

Second cycle: As soon as the command valid signal CMDV which is kept to the high level is driven to be in the low level, the register address REG-ADD to select the desired register from the second cycle data register is inputted via the data bus DQ[k:0]. As a result, the difference and the mask generated in the decoding circuit can be written to the second cycle data register.

Third cycle: It is a wait state. In the CAM, the above-mentioned read operation and decoding operation are continuously performed.

Fourth cycle: The read acknowledge signal ACK which is kept in the high impedance condition is driven to the low level and the data bus DQ is brought to the valid state. Thereafter, the output of the minimum value and the data to the data bus DQ[k:0] begin.

Fifth cycle: The read acknowledge signal ACK which is kept to the low level is driven to the high level. In such a case, the read information is outputted to the data bus DQ.

Sixth cycle: The read acknowledge signal ACK which is kept to the high level is driven to the low level.

First half of the seventh cycle (7A cycle): The read acknowledge signal ACK which is kept to the low level is brought to the high impedance state. Then, similar to the 1A cycle, the command valid signal CMDV which is brought to the low level is driven to the high level and at the same time, the read command is inputted by using the command signal group CMD[1:0]. In addition, by setting the command signal group CMD[n:2] to the desired value, the second cycle data register SDREG and the information identification register DIREG set to the value suitable for the format of the information to be read from now are selected from the various register block REGB shown in FIG. 1, and a part of the address of the external content memory used together with this embodiment is inputted. Furthermore, the register address REG-ADD to select the desired register from the second cycle data register is inputted via the data bus DQ[k:0].

Latter half of the seventh cycle (7B cycle): Following the 7A cycle, the input of the read command and the selection of the second cycle data register SDREG are continued.

Eighth to ninth cycles: The command valid signal CMDV which is kept to the high level is driven to the low level. In the CAM, the read operation from the second cycle data register SDREG is continuously performed.

Tenth cycle: The read acknowledge signal ACK which is kept in the high impedance condition is driven to the low level and the data bus DQ is brought to the valid state. Thereafter, the output of the difference and the mask to the data bus DQ[k:0] begins.

Eleventh cycle: The read acknowledge signal ACK which is kept to the low level is driven to the high level. At this time, the difference and the mask are being outputted to the data bus DQ.

Twelfth cycle: The read acknowledge signal ACK which is kept to the high level is driven to the low level.

Thirteenth cycle: the read acknowledge signal ACK which is kept to the low level is driven to the high impedance condition to return to the wait state.

In the above-mentioned operation, the operation to read the encoded entry from the memory array in 12 cycles has been described. However, it is easily understood that, when reading the value set to the various register block REGB of FIG. 1, the operation is carried out in the same manner as the case of reading the difference and the mask from the second cycle data register SDREG. By these operations, it is possible to carry out the read operation in 6-cycle number from both of the memory arrays and the registers, and the control of the CAM according to this embodiment becomes easy.

Figure 8:
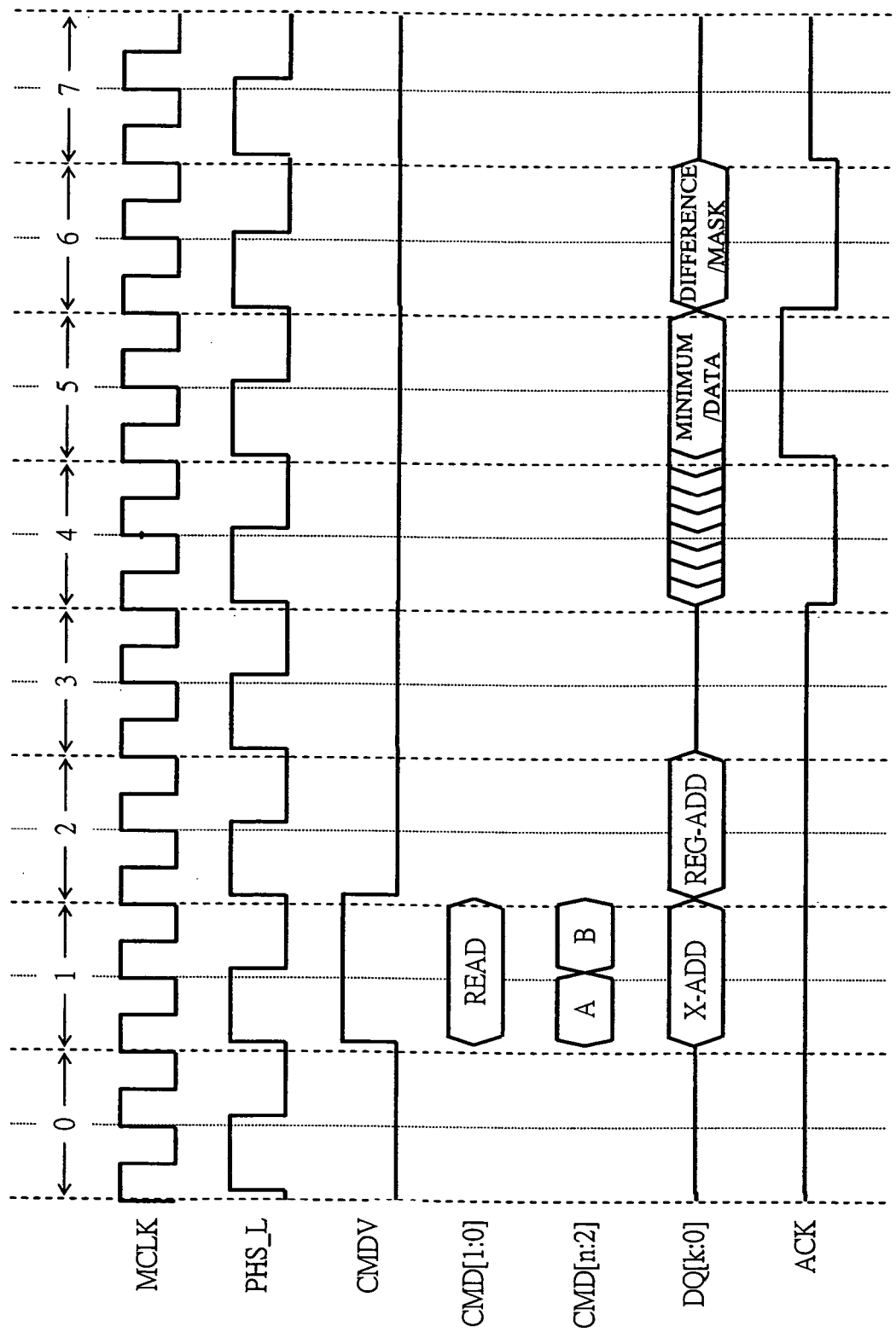
FIG. 8 is an explanatory diagram showing another example of the operation timing when an entry is read in the content addressable memory of FIG. 1.

Note that the read operation of the entry from memory arrays is not limited to the operations shown in the timing chart of FIG. 7 and various modifications are possible. For example, as shown in FIG. 8, it is possible to read the difference and the mask at the 6th cycle after reading the minimum value and the data. In such a case, the reading cycle can be reduced by half from 12 cycles to 6 cycles, and the search operation prohibited period can be shortened. In addition, when reading the value set to the various register block REGB of FIG. 1, a default value set to the value at which no access to memory cells is made is inputted as the low address X-ADD in the first cycle. In response to this, the CAM shown in FIG. 1 outputs a different default value which does not mean the memory information as the minimum value and the data in the fifth cycle, and outputs a register value instead of the difference and the mask in the sixth cycle. By the operation described above, similar to FIG. 7, it becomes possible to carry out the read operation from the various register block REGB in 6-cycle number.

(Search Operation)

Figure 9A:
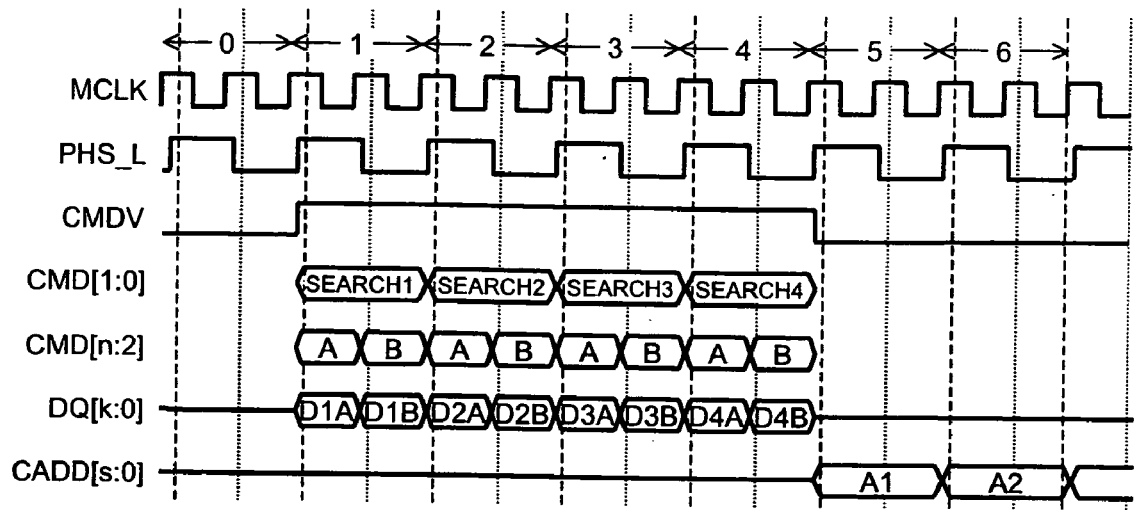
FIG. 9 is an explanatory diagram showing an example of the search operation timing in the content addressable memory of FIG. 1.
Figure 9B:
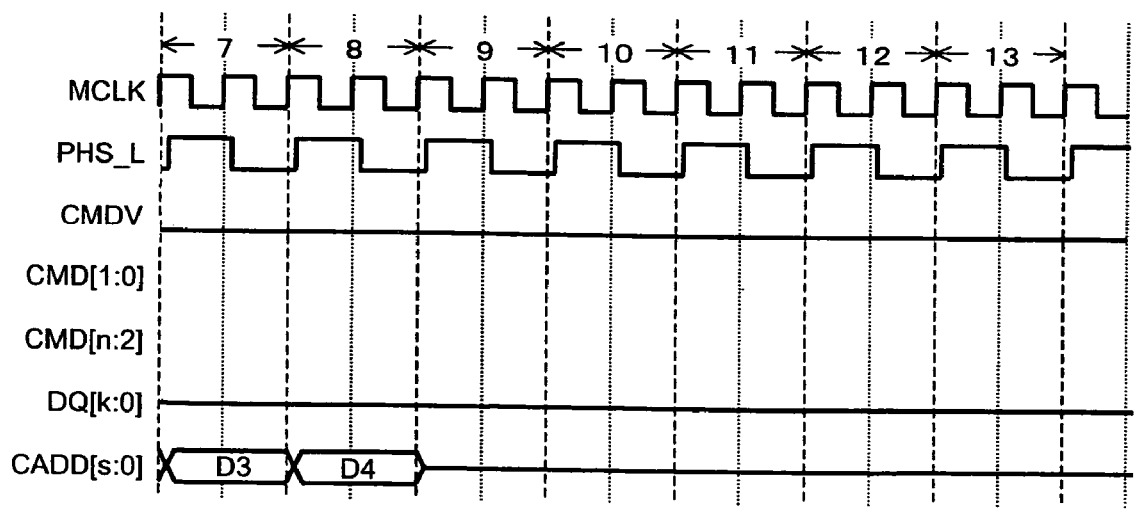

FIG. 9 shows a timing chart of a write operation of the CAM in this embodiment. In FIG. 9, the case where the master clock MCLK frequency is double of the phase signal PHS_L is shown. However, in the following description on the operation, the number of cycles will be counted in accordance with the phase signal PHS_L. Assuming that the 2(k+1) bit entry is registered to CAM, the operation of FIG. 9 corresponds to the operation in which four search keys are successively compared. The feature of this operation lies in the point that the minimum value and the data only are inputted unlike the write operation, and the difference and the mask set in the first cycle data register FDREG in advance in FIG. 1 are selected by the command signal group and encoded, and then, inputted to the memory arrays. Note that the information identification register shown in FIG. 1 is set in advance to the value suitable for the format of the information to be processed.

First half of the first cycle (1A cycle): The command valid signal CMDV which is brought to the low level is driven to the high level and at the same time, the search command is inputted by using the command signal group CMD[1:0]. In addition, by setting the command signal group CMD[n:2] to the desired value, the desired first cycle data register FDREG and the information identification register DIREG set to the value suitable for the format of the information to be searched from now are selected from the various register block REGB shown in FIG. 1, and the flag signals that indicate the data length of the search key and the entry are inputted. Furthermore, the first half bit D1 of the first search key of the 2(k+1) bit is inputted via the data bus DQ[k:0]. This search key is encoded and inputted to, for example, the memory array MAA of FIG. 1, and the comparison operation is performed.

Latter half of the first cycle (1B cycle): Following the 1A cycle, the search command is continuously inputted and the data patterns that select the Comparand register CPREG and the match address register MAREG are inputted via the external command group CMD[n:2]. In addition, the latter-half bit D2 of the first search key of 2(k+1) bit is inputted via the data bus DQ[k:0]. This search key is inputted to, for example, the memory array MAB of FIG. 1 after being encoded, and the comparison operation is performed.

Second to fourth cycles: The same operation as the first cycle is repeated, and the second to fourth search keys are divided into two and inputted every other cycle. Thereafter, these search keys are appropriately stored in the Comparand register and the match address register, respectively and sequentially compared by the pipeline operation. By doing so, the matched address is detected.

Fifth cycle: The command valid signal CMDV which is kept to the high level is driven to the low level and the reception of the search key is finished. Also, the content memory address A1 in accordance with the comparison result by the first search key is outputted.

Sixth to eighth cycles: The content memory addresses A2 to A4 in accordance with the comparison results by the second to the fourth search keys are sequentially outputted from the content address bus CADR[s:0] every other cycle.

By the foregoing configurations and operations, the CAM shown in FIG. 1 and FIG. 4 can achieve the following two effects. First, since the two kinds of encoding circuits (in this case, quaternary information encoding circuit and ternary information encoding circuit) are provided in units of the encoded block number (in this case, in units of 2 bits) in the internal data bus DBS, it becomes possible to carry out the encoding in accordance with the entries or search keys with various configurations while achieving the reduction of the circuit area. That is, in the IP address region, the IP addresses whose range is designated can be stored with a small number of entries by using the quaternary information encoding circuit.

In addition, in the flag region, the two flag signals can be stored in one memory block by using the ternary information encoding circuit. That is, it becomes possible to efficiently store the entries. Second, since the plurality of information identification registers DIREG which record the assignment of the regions in the entry and the search key are provided and the desired register is selected in accordance with the operation by using the external command signal group CMD, it becomes possible to cope with the entries and search keys with various kinds of configurations. That is, it becomes possible to simultaneously improve the versatility of the information processed by the CAM and the availability to users.

The usage of the CAM described above will be described below with the application to the network router taken as an example.

(Application to the Network Router)

Figure 10:
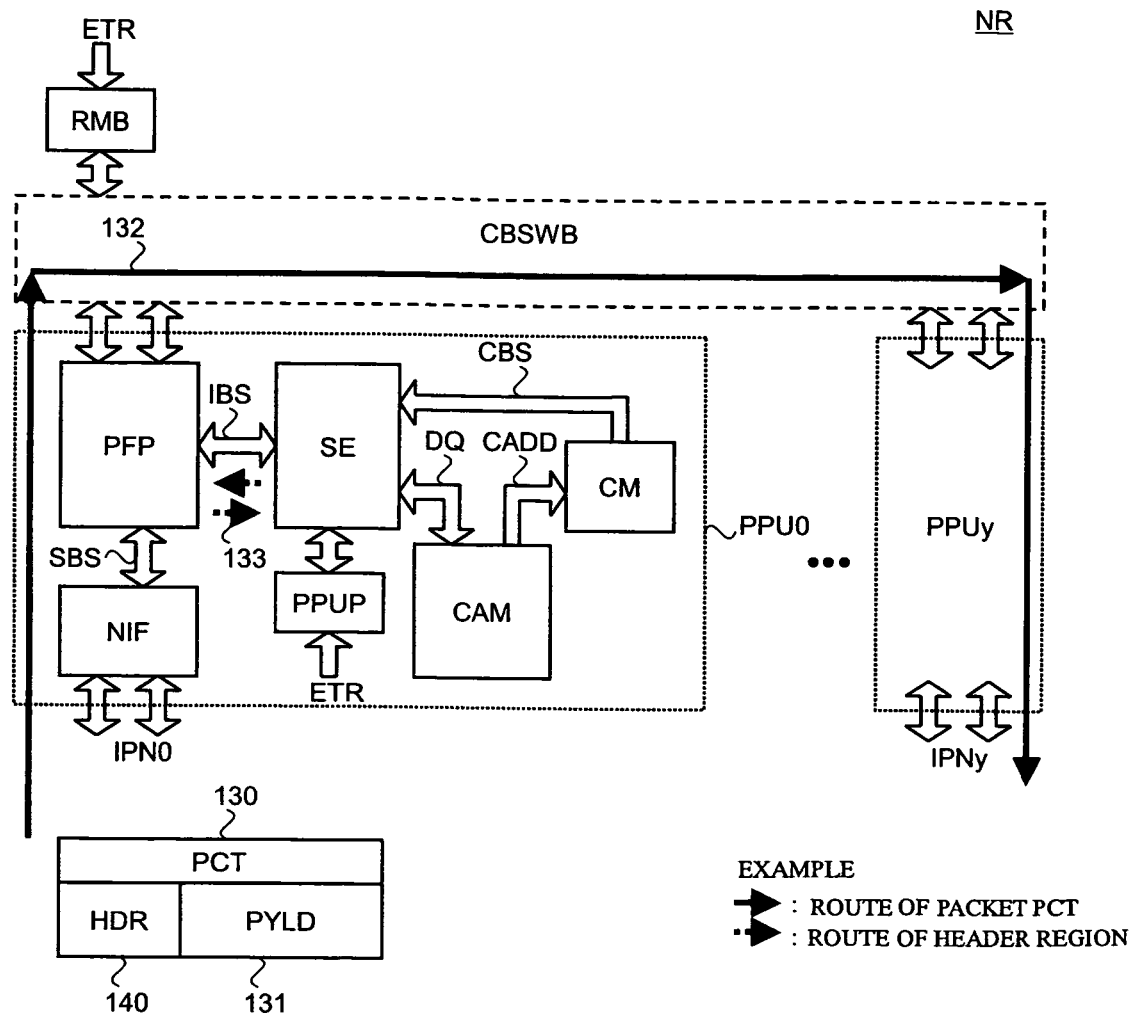
FIG. 10 is an explanatory diagram schematically showing an example of configuration of the router.

FIG. 10 shows a configuration example of a network router NR to which the CAM according to the present invention is applied. In FIG. 10, for the simplification of the description, a router manager block RMB, a crossbar switch block CBSWB, and packet processor units PPU0 to PPUy are shown as principal parts. The router manager block RMB comprises a plurality of central processing units (CPU) and performs the setting and the control of the whole network router. The crossbar switch block CBSWB connects desired packet processor units in accordance with the transfer route of the packet to be processed. The packet processing units PPU0 to PPUy are blocks which transfer/receive the packets between the corresponding networks IPN0 to IPNy.

Figure 11:
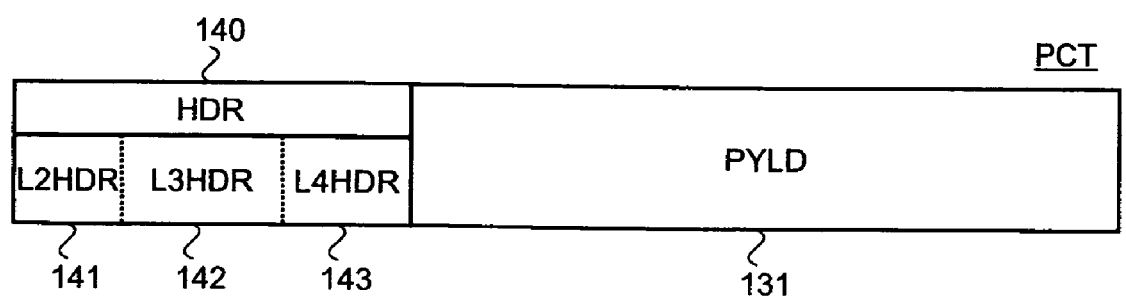
FIG. 11 is an explanatory diagram schematically showing an example of the configuration of a packet that is transferred by the router of FIG. 10.

Note that reference numeral 130 schematically denotes the packet PCT processed by this network router. The packet PCT is roughly divided into two regions. One region 140 is a header region HDR and the other region 131 is a payload region PYLD. The header region HDR further comprises a plurality of (three in this case) regions as shown in FIG. 11. Reference numeral 141 denotes a header L2HDR of the second layer and has a source MAC (Media Access Control) address and a destination MAC (Media Access Control) address. Reference numeral 142 denotes a header L3HDR of the third layer and has a source IP address and a destination IP address. Reference numeral 143 denotes a header L4HDR of the fourth layer and has a protocol, that is, a source port and a destination port which indicate the high-order applications. The payload region PYLD has information designated by a sender such as a text of e-mail, a text file, and the like. Note that the arrow 132 indicated in FIG. 10 represents a transfer route of the packet PCT and the arrow 133 represents a transfer route of the header region. The detailed configuration of packet processor units PPU0 to PPUy will be described below while paying attention to the routes.

Each of packet processor units PPU0 to PPUy comprises a network interface NIF, a packet forwarding processor PFP, a search engine SE, a content addressable memory CAM according to this embodiment, a content memory CM such as DRAM, a central processing unit for packet processor unit PPUP, and the like. The network interface NIF and the packet forwarding processor PFP are connected by the system bus SBS. The packet forwarding processor PFP and the search engine SE are connected by the internal bus IBS. The search engine SE and the content addressable memory CAM are connected by the data bus DQ, and the search engine SE and the content memory CM are connected by the content data bus CBS, respectively. The content addressable memory CAM and the content memory CM are connected by the content address bus CADD, respectively.

The router NR transmits and receives a packet PCT, for example, between the Internet network IPN0 and the packet processor unit PPU0 via the network interface NIF. The packet forwarding processor PFP deciphers the content of a received packet, and transfers the header region HDR to the search engine SE while holding the payload region PYLD thereof. The search engine SE extracts the desired information from the header region by using the central processing unit PPUP for packet processor unit, combines them into the format shown in FIG. 24, and further generates the input information for each region in accordance with FIG. 3 to transfer them to the content addressable memory CAM as a search key. A large number of entries which comprise the information of the same format as that of the search key are stored in the content addressable memory CAM, and the address that complies with the entry by search operation is generated.

Figure 12:
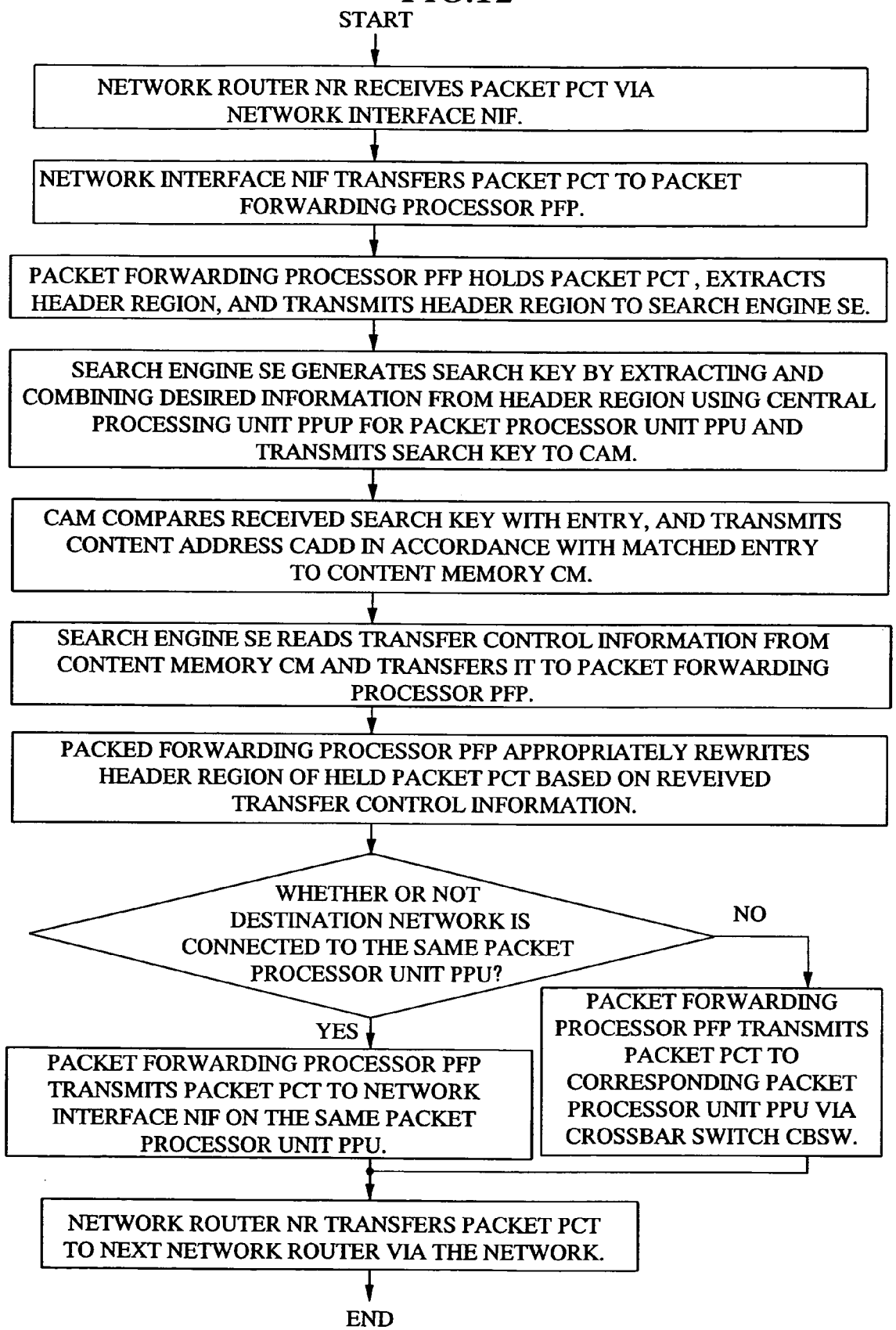
FIG. 12 is an explanatory diagram showing an example of the packet transmission processing method in the router of FIG. 10.

By inputting this address to the content memory CM via the content address bus CADD, the information concerning the relevant entry is read from the content memory CM, and is transferred to the packet forwarding processor PFP via the search engine SE. The information read here is the transfer control information which includes, for example, the optimum route information to the destination. The packet forwarding processor PFP rewrites the content of the header region HDR based on this transfer control information and reconstructs the packet PCT together with the above-mentioned payload region PYLD. Then, this packet PCT is transferred to the network connected to the network router, which is the next relay point, via the packet processor unit designated by the crossbar switch block CBSWB. FIG. 12 is a flowchart showing a series of packet transfer processing described above.

In this kind of configuration of the router NR, the search key is generated by using the search engine SE and the central processing unit PPUP for packet processor unit. On the other hand, the entry stored in the content addressable memory CAM generates and registers the information ETR set by the administrator of the router NR while analyzing it with the router manager block RMB or the central processing unit PPUP for packet processor unit. In the following description, the entry generating method in the range-specified IP address region will be described with reference to FIG. 13 and FIG. 14.

Figure 13:
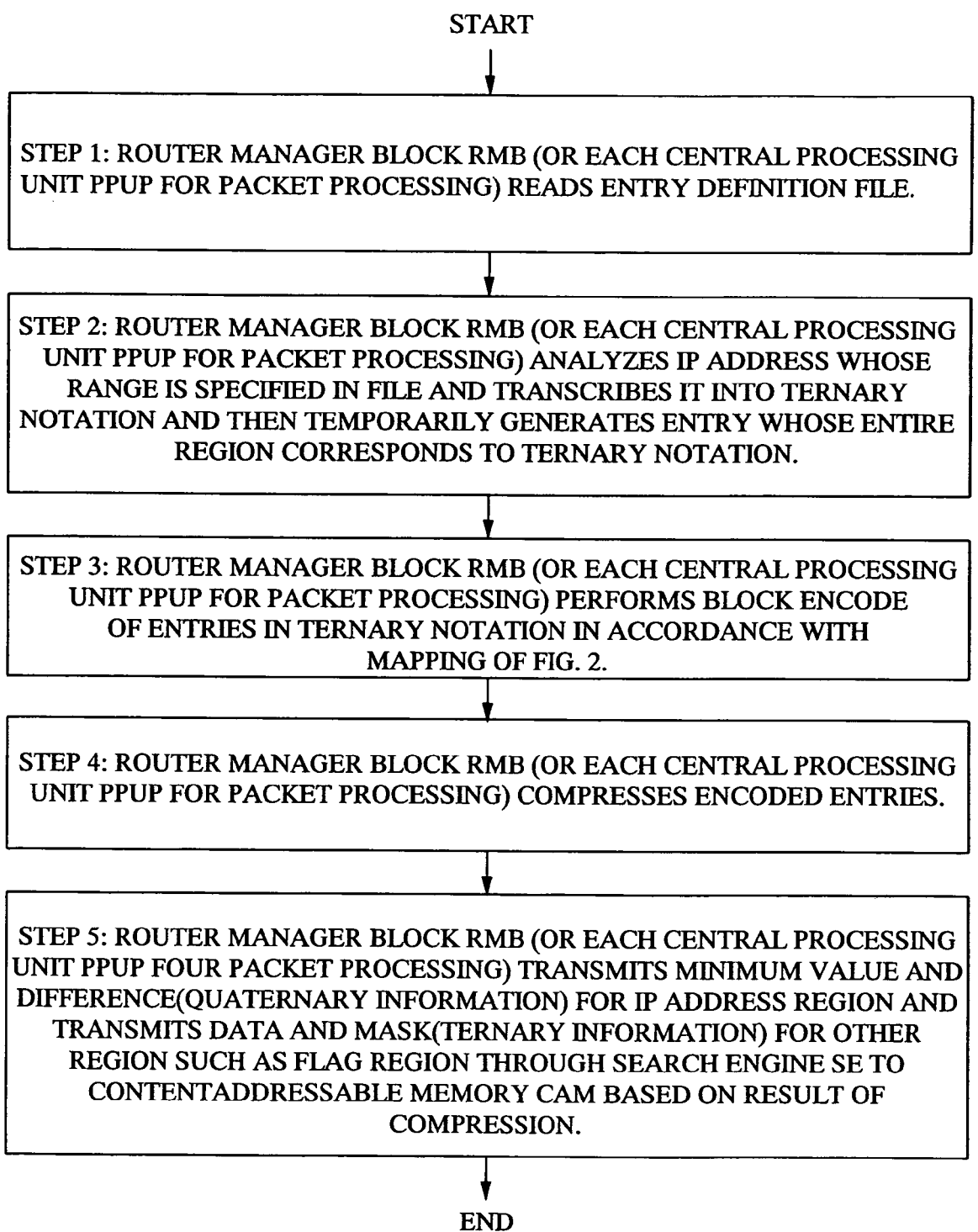
FIG. 13 is an explanatory diagram showing an example of the concept of an entry input method in the router of FIG. 10.

First of all, FIG. 13 is a flowchart showing the concept of the entry generating method. This flowchart includes the following five steps.

First step: The router manager block RMB (or each central processing unit PPUP for packet processing) reads the entry definition file.

Second step: The router manager block RMB (or each central processing unit PPUP for packet processing) analyzes the IP address whose range is specified in the definition file and transcribes into ternary notation. Then, the router manager block RMB temporarily generates the entry whose entire region corresponds to the ternary notation.

Third step: The router manager block RMB (or each central processing unit PPUP for packet processing) performs the block encode of entries in the ternary notation to blocks in accordance with the mapping of FIG. 21.

Fourth step: The router manager block RMB (or each central processing unit PPUP for packet processing) compresses encoded entries.

Fifth step: The router manager block RMB (or each central processing unit PPUP for packet processing) transmits the minimum value and the difference (quaternary information) for the IP address region and the data and the mask (ternary information) for other regions such as flag through the search engine SE to the content addressable memory CAM based on the results of the compression.

Figure 14:
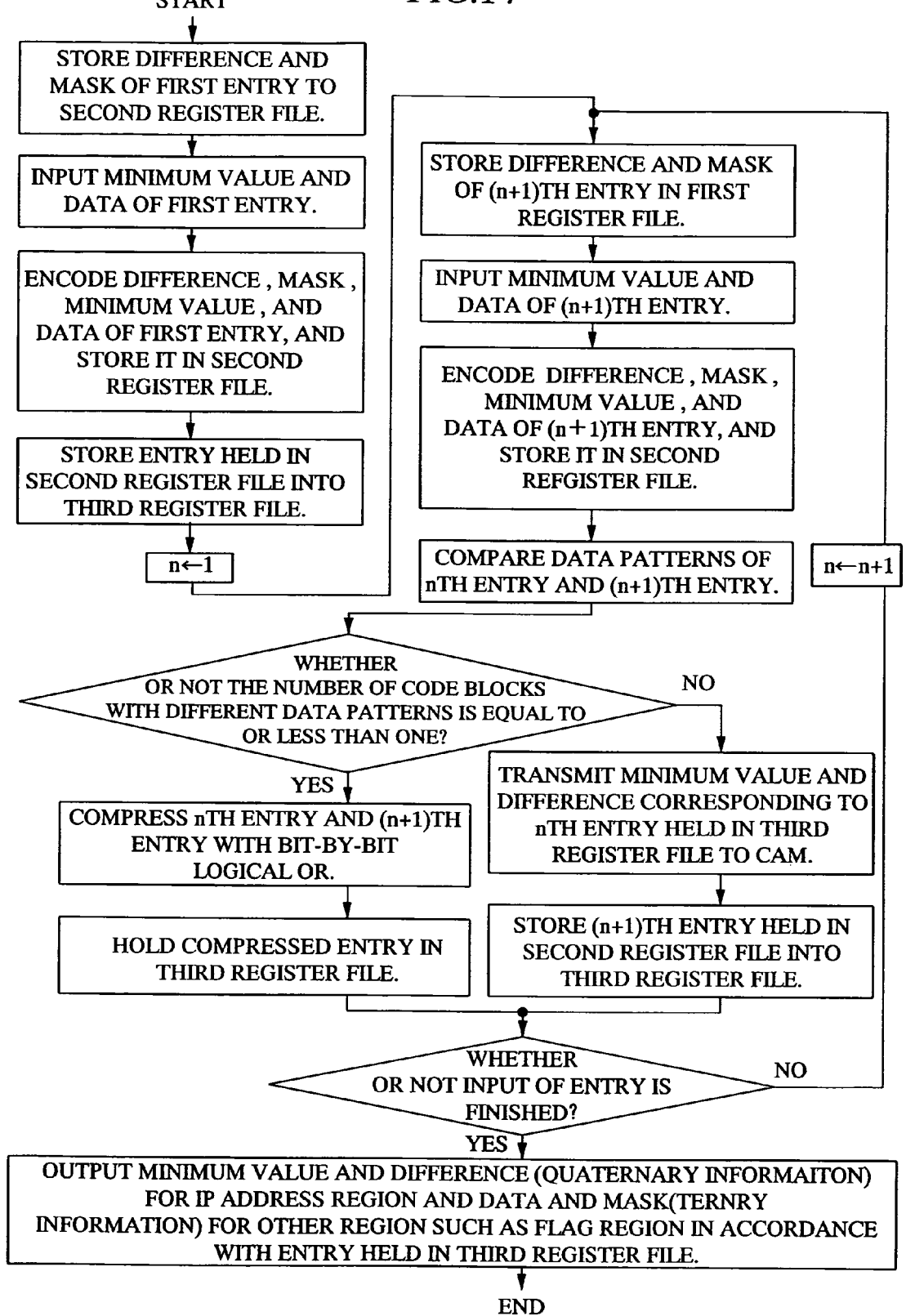
FIG. 14 is an explanatory diagram showing a specific example of the algorithm in the entry input in the router of FIG. 10.

Next, FIG. 14 shows a flowchart for encoding the entries generated in plural by decomposing the range-specified IP address into the ternary notation and its compression method. This algorithm corresponds to step 3 to step 5 of FIG. 13. This algorithm has the following three features. The first feature lies in the point that the encoding and compression are executed by the use of software on the router manager block RMB (or each central processing unit PPUP for packet processing) by using a lot of register files in comparison to the case of executing encoding and compression by the use of hardware in the CAM. The second feature lies in the point that the data patterns are compared and suitably compressed while sequentially encoding the entry shown in the manner of the ternary notation.

The third feature lies in the point that, in accordance with the entries generated as a result of compression, the minimum value and the difference (quaternary information) are outputted to the CAM for the IP address region, and the data and the mask (ternary information) are outputted to the CAM for other regions such as flags which are not compressed. By executing this kind of algorithm, the router manager block RMB (or each central processing unit PPUP for packet processing) can count the number of entries while generating the CAM input signals. That is, the router manager block RMB, each central processing unit PPUP for packet processing, the search engine SE, and other CAM control devices can easily grasp the memory array use condition in the, CAM by generating the input information which has a one-to-one relationship with the entry as described above.

[Effects of the Present Embodiment]

Finally, effects obtained from the mapping, the CAM configuration and operations described above are summarized as follows.

First of all, the first effect by the mapping of FIG. 2 and FIG. 3 lies in the point that the one-to-one relationship can be built between the CAM I/O signal and the signals encoded in the CAM. As a result, since the CAM control device can accurately grasp the number of entries, monitoring of memory use condition becomes easy. The method of generating the quaternary information used for the IP address region is as described in FIG. 13 and FIG. 14. The second effect lies in the point that the common I/O signals can be used for the entry and the search key. As a result, the common use of the encoding circuit and the decoding circuit can be realized and the CAM chip area can be reduced.

The first effect obtained from the CAM configuration of FIG. 1, FIG. 4, and FIG. 5 and the operations of FIG. 6 to FIG. 9 lies in the point that, since the two kinds of encoding circuits and decoding circuits (in this case, quaternary information encoding circuit and decoding circuit and ternary information encoding circuit and decoding circuit) are provided in units of the encoded block number (in this case, in units of 2 bits) in the internal data bus DBS, it becomes possible to carry out the encoding and the decoding in accordance with the entries or search keys with various configurations while achieving the reduction of the circuit area. That is, by using the ternary information encoding and decoding circuits for the range-unspecified one-bit information like the flag region, two flag signals can be efficiently stored in one memory block. Second, since a plurality of information identification registers DIREG which record the assignment of the regions in the entry and the search key are provided and the desired register is selected in accordance with the operation by using the external command signal group CMD, it becomes possible to cope with the entries and search keys with various configurations. That is, the versatility of the information processed by the CAM and the user availability can be simultaneously improved.

Note that the embodiment is not limited to the forms described above, and various modifications are possible. For example, in FIG. 2 and FIG. 3, the quaternary information used for the IP address region is designated as the combinations of the minimum value and the difference. However, it can be easily understood that the similar effects can be obtained by the mapping with the combination of the maximum value and the difference. In addition, in the ternary information used for the flag region, the low-level bit is designated as "Don't care". However, it can be easily understood that the similar effects can be obtained even in the mapping in which the high-level bit is designated as "Don't care". Furthermore, the mapping using the encoding in units of 2 bits has been described. However, the encoding units are not limited to this, and it can be easily understood that the encoding, for example, in units of 3 bits is also possible.

In FIG. 3, an example in which the quaternary information encoding mapping is used for the IP address region of the search key in accordance with FIG. 2 has been shown. However, in the case where a single IP address is inputted as the search key or the IP address region is masked and then searched, since the data pattern of the encoded search key is same, it is possible to apply the ternary information encoding mapping, and the desired search operation can be carried out. In addition, though the detail will be described later, in the case where the packet header is analyzed to generate the search key, since the encoding algorithm of the quaternary information described in FIG. 13 and FIG. 14 is unnecessary, the calculation amount of the CAM control device can be reduced to suppress the electric power and the time required to generate the search key can be suppressed, too.

In FIG. 5, the CAM comprised of four memory array blocks has been shown. However, the number of memory array blocks is not limited to this, and the larger number is also available. In this case, the search table comprising entries with various configurations can be stored, and the CAM availability and specification efficiency can be improved. In addition, by storing the entries with the same configuration across the plurality of memory array blocks, a large scale search table can be stored in one CAM.

In FIG. 6, the write operation in which the difference and the mask are inputted in the first-half three cycles and the minimum value and the data are inputted in the latter-half three cycles has been described. However, the encoding operation in the CAM in which the order is reversed, that is, the minimum value and the data are written in the first cycle data register in the first-half three cycles and the difference and the mask are written in the latter-half three cycles is also available. In addition, the write operation is not limited to the six cycles, and the wait state (IDLE) is probably added in accordance with the operation speed of the circuit in the CAM.

Similarly, in FIG. 7, the write operation in which the minimum value and the data are outputted in the first-half six cycles and the difference and the mask are outputted in the latter-half six cycles has been described. However, the operation in which the order is reversed, that is, the difference and the mask are directly outputted while writing the minimum value and the data in the second cycle data register in the first-half six cycles and the minimum value and the data are read from the second cycle data register in the latter-half six cycles is also available. In addition, the read operation is not limited to the twelve cycles, and the latency may be increased or decreased in accordance with the operation speed of the circuit in the CAM. With respect to FIG. 9, this is true of the time from the input of the search key to the output of the content address.

The configuration in which the address in accordance with the matched entry outputted from the content addressable memory CAM is directly inputted to the content memory CM via the content address bus CADD has been shown in FIG. 10. However, it is also possible to connect the content address bus CADD to the search engine SE and to input the address from the search engine SE to the content memory CM via a new bus. By achieving this kind of configuration, the timing design based on the operation of the search engine SE can be facilitated.

[Second Embodiment]

Next, another example of the CAM operation using the One-hot-spot block code described in first embodiment will be described. The feature of this operation lies in the point that the operation time is shortened by making use of the wide bus width of the CAM data bus DQ and applying the address signal non-multiplexing system in which the low address X-ADD and the register address REG-ADD are simultaneously inputted. The write operation and the read operation thereof will be described as follows, respectively.

(Write Operation)

Figure 15:
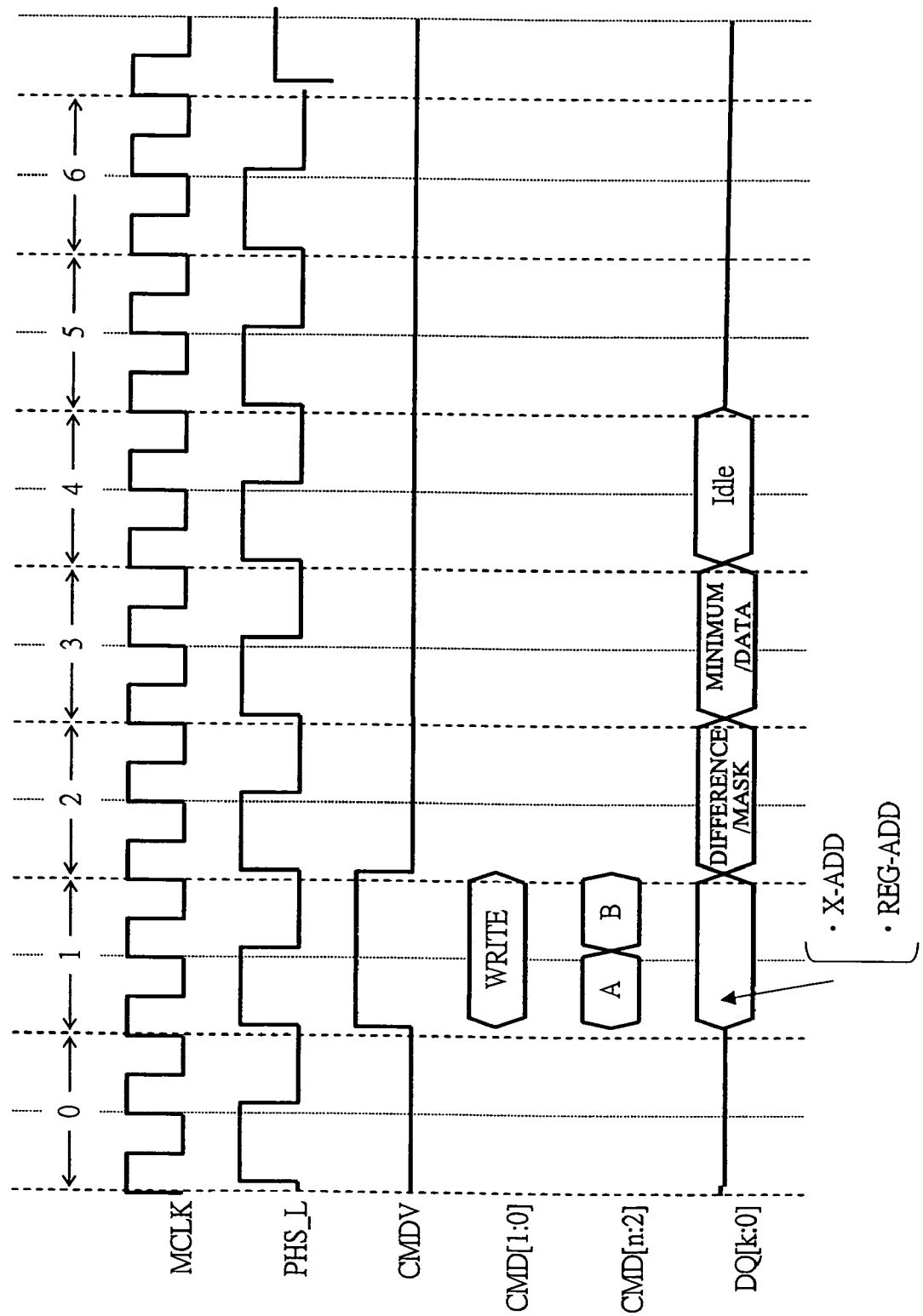
FIG. 15 is an explanatory diagram showing another example of the operation timing when the entry is written in the content addressable memory of FIG. 1.

FIG. 15 shows the timing chart of write operation of CAM in this embodiment. FIG. 15 is based on the assumption similar to FIG. 6 and waveforms using the same symbols are shown.

First half of the first cycle (1A cycle): The command valid signal CMDV which is brought to the low level is driven to the high level and at the same time, the write command is inputted by using the command signal group CMD[1:0]. In addition, by setting the command signal group CMD[n:2] to the desired value, the first cycle data register FDREG and the information identification register DIREG set to the value suitable for the format of the information to be inputted are selected from the various register block REGB shown in FIG. 1, and a part of the address of the content memory used together with this embodiment is inputted. Furthermore, the low address X-ADD for selecting the word for writing the entry and the address REG-ADD for selecting the desired register from the first cycle data register FDREG are inputted via the data bus DQ[k:0]. The low address is decoded by the low decoder XDEC shown in FIG. 1 and thereafter, the word line at the write destination is activated.

Latter half of the first cycle (1B cycle): Following the 1A cycle, the write command is inputted and the first cycle data register FDREG and the information identification register DIREG are selected.

Second cycle: The command valid signal CMDV which is brought to the high level is driven to the low level and at the same time, the difference and the mask are inputted via the data bus DQ[k:0]. These pieces of information are written in the first cycle data register FDREG selected in the first cycle.

Third cycle: The minimum value and the data are inputted via the data bus DQ[k:0]. These pieces of information are converted to the One-hot-spot block codes that correspond to the encoding circuit selected by the information identification register DIREG together with the difference and the mask inputted in the second cycle and transferred to the memory array.

Fourth cycle: It is a wait state. The write operation to the memory array is completed by the end of this cycle.

In this way, by applying the address signal non-multiplexing system, the writing time can be shortened from 6 cycles to 4 cycles.

(Read Operation)

Figure 16:
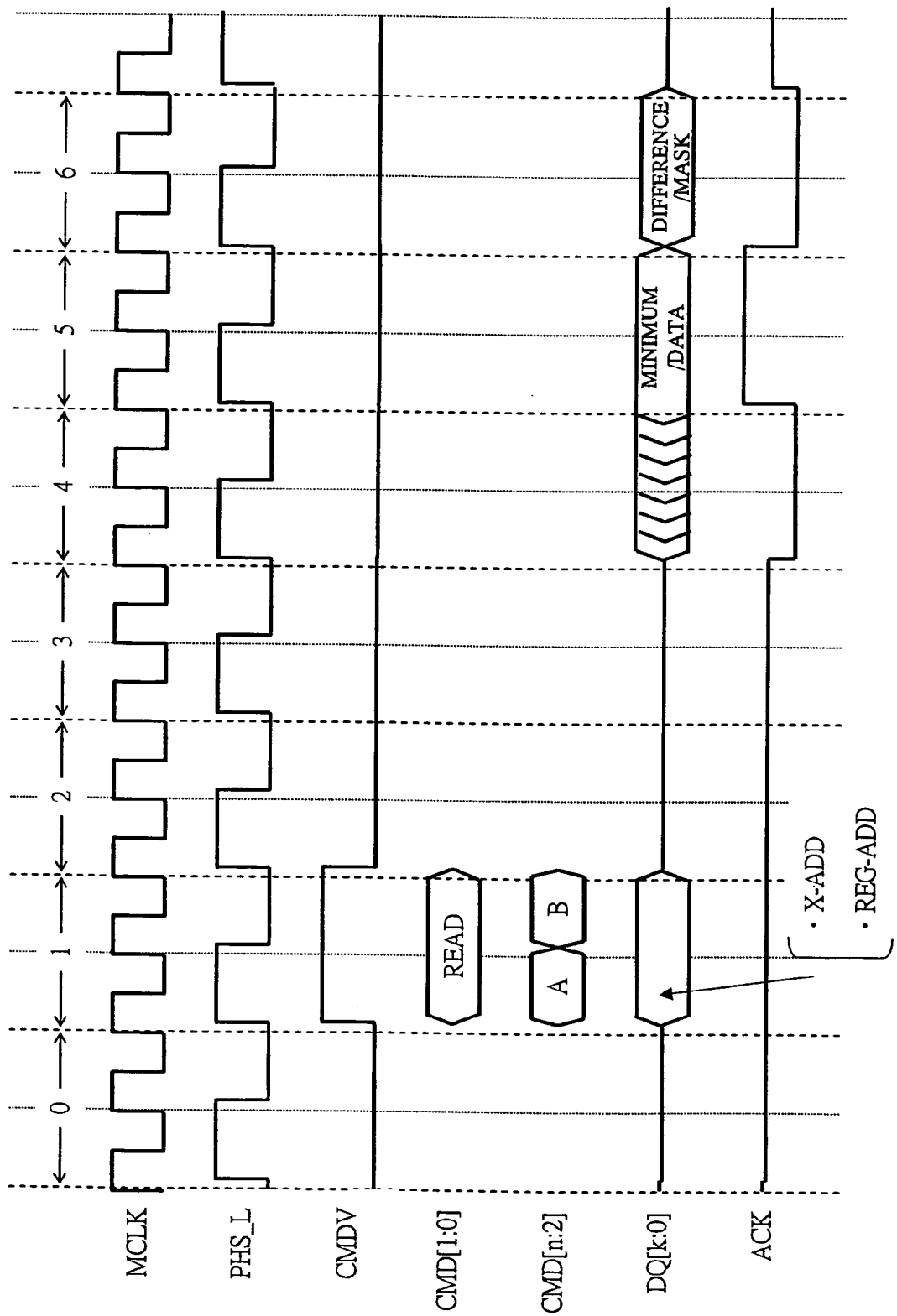
FIG. 16 is an explanatory diagram showing another example of the operation timing when the entry is read in the content addressable memory of FIG. 1.

FIG. 16 shows the timing chart of the read operation of the CAM in this embodiment. FIG. 16 is based on the assumption similar to FIG. 6 and waveforms using the same symbols are shown.

First half of the first cycle (1A cycle): The command valid signal CMDV which is brought to the low level is driven to the high level and at the same time, the read command is inputted by using the command signal group CMD[1:0]. In addition, by setting the command signal group CMD[n:2] to the desired value, the second cycle data register SDREG and the information identification register DIREG set to the value suitable for the format of the information to be read are selected from the various register block REGB shown in FIG. 1, and a part of the address of the content memory used together with this embodiment is inputted.

Furthermore, the low address X-ADD for selecting the word for reading the entry and the register address REG-ADD for selecting the desired register from the second cycle data register are inputted via the data bus DQ[k:0]. The low address is decoded by the low decoder XDEC shown in FIG. 1. Thereafter, the word line is activated and the entry is read from the memory cell, and converted to the minimum value and the data and to the difference and the mask in the decoding circuit.

Latter half of the first cycle (1B cycle): Following the 1A cycle, the input of the read command and the selection of the second cycle data register SDREG are continuously performed.

Second cycle: The command valid signal CMDV which is brought to the high level is driven to the low level.

Third cycle: It is a command input inhibited state. In the CAM, the above-mentioned read operation and decoding operation are continuously performed.

Fourth cycle: The read acknowledge signal ACK which is brought to the high impedance state is driven to the low level, and the data bus DQ is brought to the valid state. Thereafter, the output of the minimum value and the data to the data bus DQ[k:0] begins.

Fifth cycle: The read acknowledge signal ACK which is brought to the low level is driven to the high level. At this time, the minimum value and the data are definitely outputted to the data bus DQ.

Sixth cycle: The read acknowledge signal ACK which is brought to the high level is driven to the low level. The difference and the mask are outputted from the second cycle data register to the data bus DQ.

Seventh cycle: The read acknowledge signal ACK which is brought to the high level is driven to the high impedance state and returns to the wait state.

In this way, by applying the address signal non-multiplexing system, the reading time can be shortened from 12 cycles to 6 cycles.

Note that it can be easily understood that the similar effects can be obtained even if the order of inputting and outputting the minimum value and the data and the difference and the mask is reversed. In addition, the latency may be adjusted in accordance with the operation time of the circuit in the CAM. However, it can be easily understood that the operation time can be generally shortened in comparison to the first embodiment.

[Third Embodiment]

Figure 17:
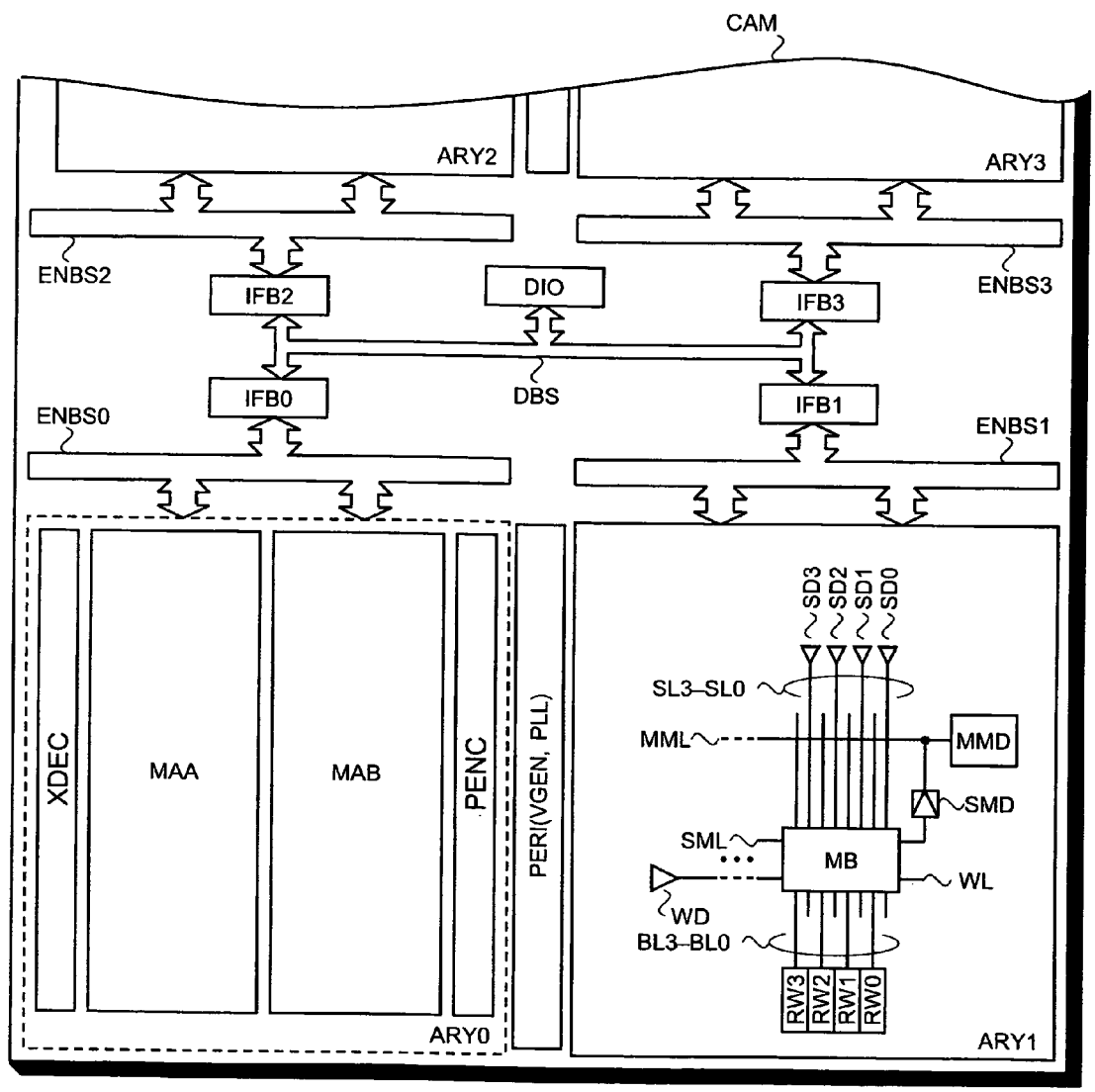
FIG. 17 is an explanatory diagram showing another example of a floor plan based on the basic configuration in the content addressable memory of FIG. 1.

Next, another example of the floor plan of the CAM applying the One-hot-spot block code described in the first embodiment will be described with reference to FIG. 17. The feature of this configuration lies in the point that the interface circuit blocks IFB0 to IFB3 are arranged for each of the memory array blocks ARY0 to ARY3, and the entry and the search key are transmitted and received between the memory array blocks ARY0 to ARY3 via the corresponding encoding data buses ENBS0 to ENBS3. Here, similar to the interface circuit block IFB shown in FIG. 5, the interface circuit blocks IFB0 to IFB3 comprise the encoding circuit ENCDR, the decoding circuit DCDR, and the various register block REGB, respectively. Therefore, in the floor plan shown in FIG. 5, the interface circuit block IFB is arranged at the intersection regions of the cruciform regions. In the present embodiment, however, the interface circuit block IFB is arranged in the region in the transverse direction where the peripheral circuit PERI is not disposed. By adopting this kind of arrangement, the following two effects can be obtained. The first effect lies in the point that the power consumption can be reduced.

That is, the bit length of the entry and the search key in the CAM of this embodiment is increased due to the encoding. In addition, as shown in the mapping of FIG. 2 and FIG. 3, since multiple bits are activated, the driving electric power of the encoding data bus is increased. However, the load capacity of the bus is reduced and the required driving electric power can be reduced by disposing the encoding data buses ENBS0 to ENBS3 in the vicinity of the corresponding memory array blocks ARY0 to ARY3. The second effect lies in the point that the search operation speed can be improved. That is, as described in FIG. 9, the search operation is carried out by the pipeline operation in the CAM. However, by masking the different regions of the same search key, various search keys can be generated for each of the plurality of memory array blocks. Therefore, when carrying out these searches in parallel, the search speed can be improved. Here, since the encoding in first embodiment reduces the number of entries required for storing the same scale search table, this is suitable for forming a plurality of search tables in the same chip.

[Fourth Embodiment]

Next, another example of the memory cell in the memory block described in the first embodiment will be described. An object of this embodiment is to eliminate the search operation prohibited time and to increase the number of searches of the CAM by achieving the memory cell structure which does not need refresh operation. In addition, it is another object of this embodiment to eliminate any special processes such as capacitor formation so as to reduce the unit price of the bit.

Figure 18:
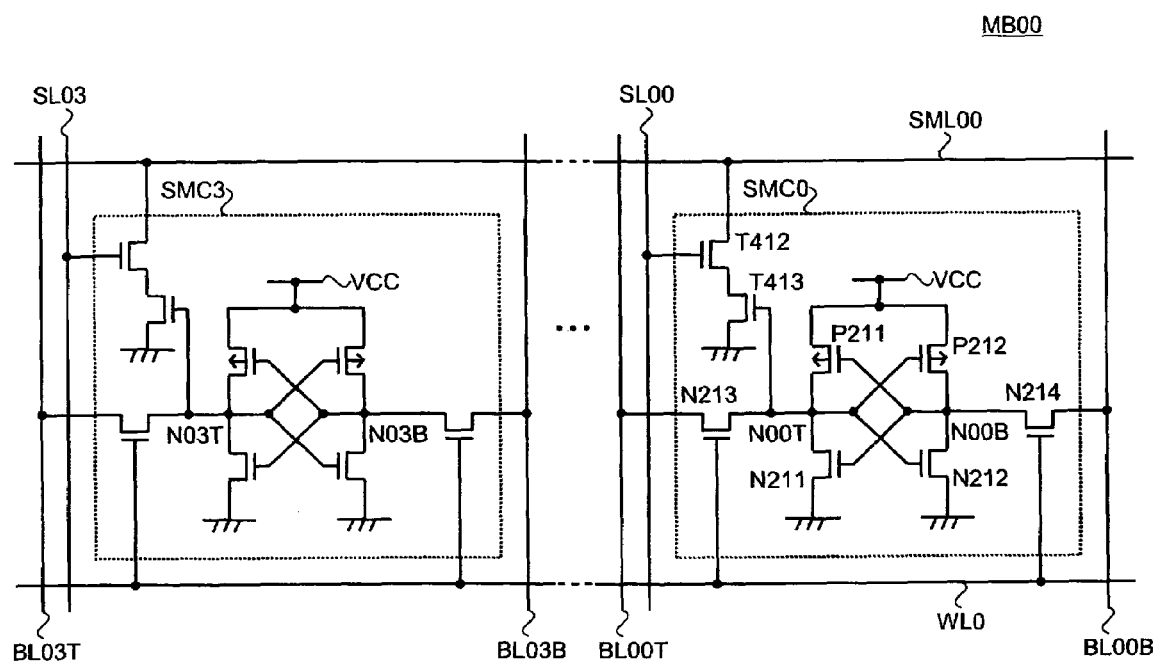
FIG. 18 is an explanatory diagram showing another example of the memory block configuration in the memory array of FIG. 22.
Figure 19:
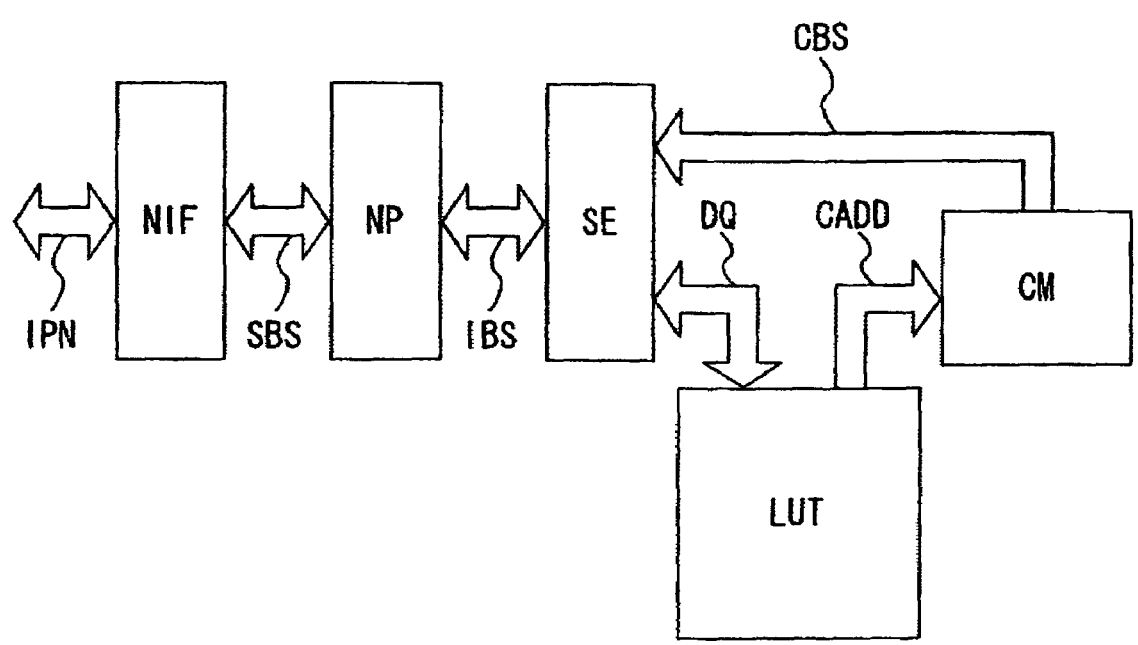
FIG. 19 is an explanatory diagram schematically showing the configuration example of a router.

FIG. 18 shows a memory block MB00 according to this embodiment corresponding to FIG. 23. The memory block MB00 comprises four memory cells SMC0 to SMC3 as is the case of FIG. 23. The difference in configuration of the memory cell is that the MOS transistor N411 and the capacitor C are replaced by publicly known SRAM cell which comprise two PMOS transistors P211 and P212 and four NMOS transistors N211, N212, N213 and N214 as represented by the memory cell SMCO. Since the positive feedback is applied by the cross-coupled transistors P211 and P212 and NMOS transistors N211 and N212, the memory nodes N00T and N00B are held to either of the voltage levels, that is, the power supply voltage VCC or the ground voltage VSS in accordance with the entry. Consequently, no entry refresh operation is required unlike the case of the memory cell of FIG. 23. Therefore, the search operation can be constantly performed.

Note that, in FIG. 18, bit lines form a complementary signal line pair as is the case of the bit lines BL00T and BL00B in accordance with the SRAM cell that comprises six transistors. However, the cell configuration is not limited to this, and various modifications are possible. For example, the configuration using the PMOS transistor and the poly-silicon resistor are used instead and the configuration in which the MOS transistor pair of either one of the polarities is eliminated from the four cross-coupled MOS transistors are possible. In this case, since the number of transistors is reduced, the cell area can be reduced. In addition, it is also possible to apply the SRAM cell comprised of five transistors by eliminating the transistor N214. In this case, since the bit lines with negative polarity (in this case, BL00B to BL03B) can be eliminated, the layout of the memory cell can be simplified and the cell area can be reduced by reducing the number of wirings.

In the foregoing, the invention made by the inventors of the present invention has been specifically described on the basis of the embodiments of the present invention. However, it is needless to say that the present invention is not limited to the above-mentioned embodiments, and various modifications can be made within the scope of the invention. For example, the CAM according to the present invention is not limited to an off-chip, that is, a single device, and the present invention can be applied to the CAM block which is mounted to the system LSI generally called a system-onchip (SoC). Also in this case, the effects similar to those obtained in the embodiments described above can be obtained. In addition, memory cells such as a flash memory, a ferroelectric RAM (ferroelectric random access memory) and an MRAM (magnetoresistive random access memory) can be applied in addition to the DRAM cell of FIG. 23 and the configuration using the SRAM cell of FIG. 18. In this case, since all of them are nonvolatile memory cell structures, even if any power supply shut-off accident occurs, the operation can be resumed in a short time. Furthermore, in FIG. 23 and FIG. 18, the memory cell configuration in which the NMOS transistors are connected in series in order of T412 and T413 between the submatch line and the ground electrode is shown. However, the same search operation is possible even if the order is reversed.

As described above, the semiconductor device related to the present invention can be mounted to a system in the same manner as the conventional TCAM by slightly changing the software, while increasing the amount of information per one entry concerning various kinds of information as well as the IP address. Also, it is suitable for a technique to carry out the search operations with using a table having the large information volume.

What is claimed is:

1. A semiconductor device, comprising:

an I/O circuit provided between a plurality of first signal lines and a plurality of second signal lines;

an encoding circuit having input terminals to which said plurality of second signal lines are connected;

a decoding circuit having output terminals to which said plurality of second signal lines are connected; and a plurality of memory arrays, wherein said I/O circuit transmits and receives first information based on a first mapping and second information based on a second mapping, wherein said encoding circuit outputs third information encoded from said first information or said second information to said plurality of memory arrays, wherein said decoding circuit outputs said first information or said second information generated by decoding said third information received from said plurality of memory arrays to said I/O circuit, wherein said memory arrays store said third information and compare said stored third information with said third information newly inputted, and wherein said stored third information and said newly inputted information are outputted from the same output node of said encoding circuit.

2. The semiconductor device according to claim 1, wherein said encoding circuit is provided with a first encoding circuit unit for said first information and a second encoding circuit unit for said second information, and said first encoding circuit unit or said second encoding circuit unit is selectively activated in accordance with information to be processed, and wherein said decoding circuit is provided with a first decoding circuit unit for said first information and a second decoding circuit unit for said second information, and said first decoding circuit unit or said second decoding circuit unit is selectively activated in accordance with information to be processed.

3. The semiconductor device according to claim 2, further comprising:

a first register which identifies whether a format of the information to be processed is based on said first mapping or said second mapping, wherein said first or second encoding circuit unit and said first or second decoding circuit unit are selected in accordance with a value set to said first register.

4. The semiconductor device according to claim 3, wherein said first register comprises a plurality of register units, and wherein said semiconductor device uses commands and register addresses inputted from outside the semiconductor device to select a desired register unit from said plurality of register units, to carry out encoding and decoding in accordance with the format of information to be processed.

5. The semiconductor device according to claim 4, wherein said encoding circuit is used for a read operation and a search operation.

6. A semiconductor device, comprising:

an I/O circuit provided between a plurality of first signal lines and a plurality of second signal lines;

an encoding circuit having input terminals to which said plurality of second signal lines are connected;

a decoding circuit having output terminals to which said plurality of second signal lines are connected; and a plurality of memory arrays, wherein said I/O circuit transmits and receives first information based on a first mapping and second information based on a second mapping, wherein said encoding circuit outputs third information encoded from said first information or said second information to said plurality of memory arrays, wherein said decoding circuit outputs said first information or said second information created by decoding said third information received from said plurality of memory arrays to said I/O circuit, and wherein said memory arrays store said third information and compare said stored third information with said third information newly inputted.

7. The semiconductor device according to claim 6, wherein said encoding circuit is provided with a first encoding circuit unit for said first information and a second encoding circuit unit for said second information, and said first encoding circuit unit or said second encoding circuit unit is selectively activated in units of multi-divided parts of said plurality of second signal lines in accordance with information to be processed, and wherein said decoding circuit is provided with a first decoding circuit unit for said first information and a second decoding circuit unit for said second information, and said first decoding circuit unit or said second decoding circuit unit is selectively activated in units of multi-divided parts of said plurality of second signal lines in accordance with information to be processed.

8. The semiconductor device according to claim 7, further comprising:

a first register which identifies whether a format of the information to be processed is based on said first mapping or said second mapping, wherein said first or second encoding circuit unit and said first or second decoding circuit unit are selected in accordance with a value set to said first register.

9. A semiconductor device, comprising:

an I/O circuit provided between a plurality of first signal lines and a plurality of second signal lines;

an encoding circuit having input terminals to which said plurality of second signal lines are connected;
a decoding circuit having output terminals to which said plurality of second signal lines are connected; and
a plurality of memory arrays,
wherein said I/O circuit transmits and receives first information based on a first mapping or second information based on a second mapping,
wherein said encoding circuit outputs third information encoded from said first information or said second information to said plurality of memory arrays,
wherein said decoding circuit outputs said first information or said second information generated by decoding said third information received from said plurality of memory arrays to said I/O circuit,
wherein said memory arrays store said third information and compare said stored third information with said third information newly inputted,
wherein an I/O signal for said information based on the first mapping is a combination of a minimum value and a difference, and
wherein an I/O signal for said information based on the second mapping is a combination of data and a mask.

10. The semiconductor device according to claim 9, wherein said semiconductor device transmits and receives said combination of the minimum value and the difference or said combination of the data and the mask in twice.

* * * * *